US006423976B1

United States Patent
Glavish et al.

(10) Patent No.: US 6,423,976 B1
(45) Date of Patent: Jul. 23, 2002

(54) ION IMPLANTER AND A METHOD OF IMPLANTING IONS

(75) Inventors: Hilton F. Glavish, Incline Village, NV (US); John Stuart Gordon, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/321,731

(22) Filed: May 28, 1999

(51) Int. Cl.$^7$ .............................................. H01J 37/317

(52) U.S. Cl. .................... 250/492.21; 315/505

(58) Field of Search .......................... 250/396 R, 398, 250/492.1–492.3, 396 ML, 492.21; 315/500, 505, 506, 5.41

(56) References Cited

U.S. PATENT DOCUMENTS

| | | | | |
|---|---|---|---|---|
| 4,254,340 A | * | 3/1981 | Camplan et al. | 250/492 A |
| 4,485,346 A | | 11/1984 | Swenson et al. | 328/233 |
| 4,667,111 A | | 5/1987 | Glavish et al. | 250/492.2 |
| 4,782,304 A | * | 11/1988 | Aitken | 328/233 |
| 4,896,036 A | * | 1/1990 | Rose et al. | 250/310 |
| 5,003,183 A | | 3/1991 | Nogami et al. | 250/492.2 |
| 5,156,703 A | * | 10/1992 | Oechsner | 156/643 |
| 5,216,253 A | * | 6/1993 | Koike | 250/492.2 |
| 5,229,615 A | | 7/1993 | Brune et al. | 250/492.2 |

(List continued on next page.)

FOREIGN PATENT DOCUMENTS

| | | | |
|---|---|---|---|
| EP | 0345006 A2 | * | 6/1989 |
| JP | 7-57897 | | 3/1995 |
| JP | 7-57898 | | 3/1995 |
| JP | 9-237700 | | 9/1997 |
| WO | WO99/13488 | | 3/1999 |

OTHER PUBLICATIONS

The Development of a Beam Line Using an RFQ and 3–Gap RF Accelerators for High Energy Ion Implanter, Fujisawa et al, Presented at IIT, Kyoto, Jun. 24, 1998.
Heavy Ion Post–Acceleration on the Heidelberg MP Tandem Accelerator, Edited by J.P. Wurm, Max Planck Institute for Nuclear Physics, Heidelberg, May 1976.
Superconducting Linacs Used With Tandems, Llanben–ZVI, Nuclear Instruments and Methods in Physics Research 220 (1984, 177–185.
Theory of Linear Accelerators, by A.D. Vlasov, Chapter 2.5 "Preliminary Bunching and Debunchers" pp. 65–71, Published in English 1968.
Production High Energy Ion Implanter Using Radio Frequency Accerleration, by Glavish et al, Nuclear Instruments and Methods in Physics Research, B21 (1987) 264–269.
Radio Frequency Accelerator, by M.J. Barrett, pp. Implantation: Equipment and Techniques, Proceedings of the Fourth International Conference, Berchtesgaden, Germany, Sep. 13–17, 1982.

(List continued on next page.)

Primary Examiner—Kiet T. Nguyen
(74) Attorney, Agent, or Firm—Boult Wade Tennant

(57) ABSTRACT

An ion implanter employs two three gap rf accelerator stages to boost the implant energy after mass selection. The electrodes of the accelerator stages have slit-shaped apertures that accommodate high beam current, when the accelerator is in drift mode. By particular choice of the parameters of the accelerator, each stage of the accelerator produces accelerated ions having a relatively small energy spread, even though the acceptance range of the accelerator stage extends over a substantial phase angle of the applied rf voltage. The resulting accelerator is flexible, permitting a wide variation of output energies with good beam dynamics. Ion bunches from the first three gap stage are caused to have the correct flight time to reach the second stage for acceleration by adjusting the speed of the ions while maintaining the rf phase of the fields in the two stages locked to fixed values.

29 Claims, 20 Drawing Sheets

U.S. PATENT DOCUMENTS

| | | | | |
|---|---|---|---|---|
| 5,349,196 A | * | 9/1994 | Amemiya et al. | 250/492.21 |
| 5,389,793 A | | 2/1995 | Aitken et al. | 250/492.21 |
| 5,393,984 A | | 2/1995 | Glavish | 250/396 |
| 5,481,116 A | * | 1/1996 | Glavish et al. | 250/396 ML |
| 5,483,077 A | * | 1/1996 | Glavish | 250/492.2 |
| 5,504,341 A | * | 4/1996 | Glavish | 250/492.21 |
| 5,734,168 A | * | 3/1998 | Yao | 250/492.3 |
| 5,744,919 A | * | 4/1998 | Mishin et al. | 315/505 |
| 5,801,488 A | | 9/1998 | Fujisawa | 315/5.41 |
| 5,834,786 A | * | 11/1998 | White et al. | 250/492.21 |
| 6,192,089 B1 | * | 2/2001 | Corleto et al. | 375/344 |
| 6,194,734 B1 | * | 2/2001 | Loomis et al. | 250/492.21 |

OTHER PUBLICATIONS

Upgrading of Single Stage Accelerators, by Bethge et al., pp. 461–468, Proceedings of the Fourth Conference of the Scientific and Industrial Applications of Small Accelerators: North Texas State University, Oct. 27–29, 1976.

* cited by examiner

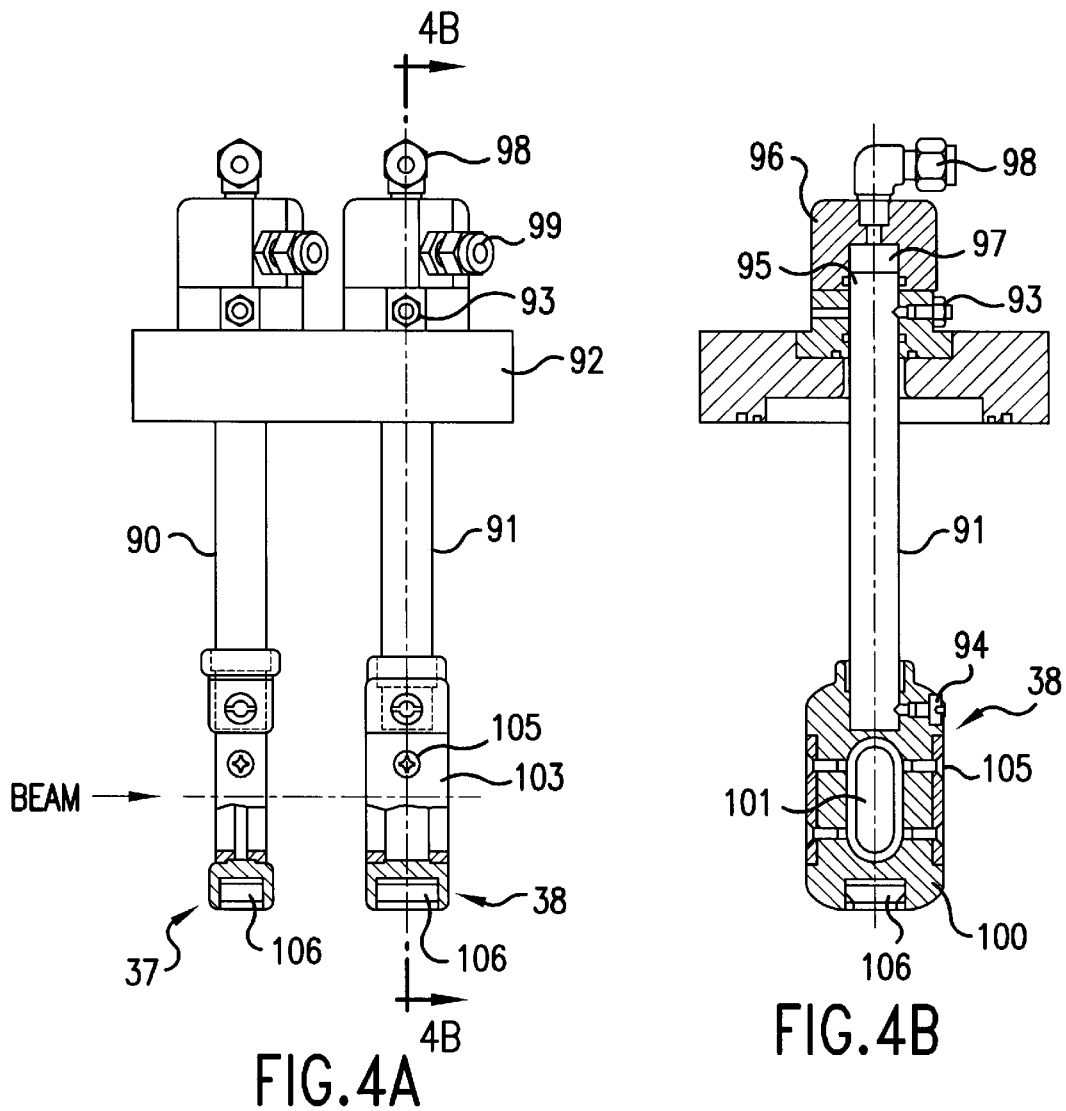
FIG.4A
FIG.4B
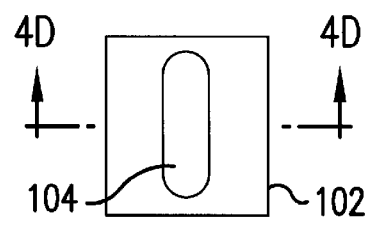
FIG.4C
FIG.4D

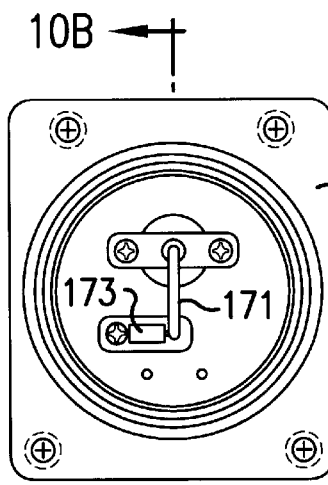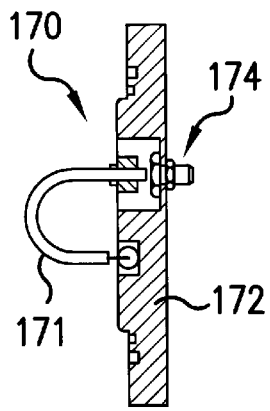
FIG.10A
FIG.10B
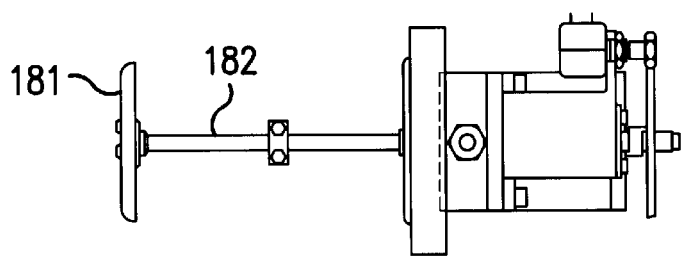
FIG.11A
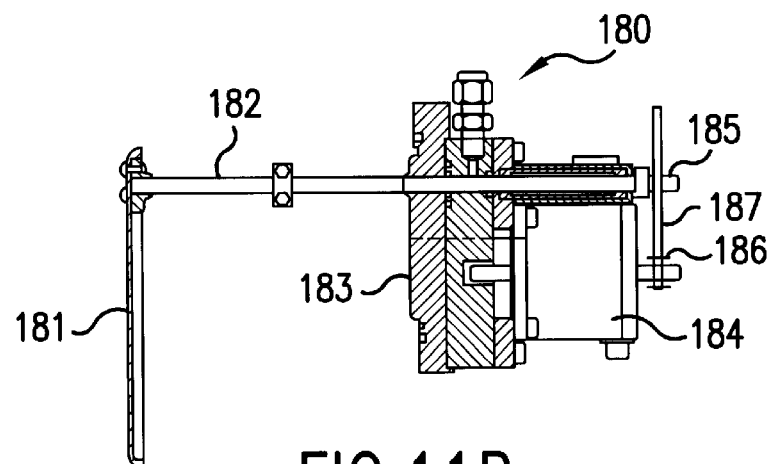
FIG.11B

ION IMPLANTER AND A METHOD OF IMPLANTING IONS

FIELD OF THE INVENTION

The invention is concerned with ion implanters and with a method of ion implantation.

BACKGROUND OF THE INVENTION

Ion implanters have been used for many years in the processing of semiconductor wafers. Typically, a beam of ions of a required species is produced and directed at a wafer or other semiconductor substrate, so that ions become implanted under the surface of the wafer. Implantation is typically used for producing regions in the semiconductor wafer of altered conductivity state, by implanting in the wafer ions of a required dopant. Typical ionic species used for this purpose are boron, phosphorous, arsenic and antimony. However, other ionic species are also used for other purposes, including oxygen for example.

The depth to which implanted ions penetrate the surface of the wafer is largely dependent on the energy of the ions in the ion beam. The semiconductor industry requires both very shallow implants, for example for very fine structures having a small feature size, and relatively deep implants, for example for buried layers etc. It is also a general requirement of the semiconductor processing industry that process times should be as short as possible which implies that the quantity of ions being implanted per unit area and time into a semiconductor wafer should be as high as possible. This implies that ion implantation is conducted with a high beam current, being a measure of the number of required ions in the beam reaching the wafer surface per unit time.

Beam energies up to about 200 keV (for singly charged ions) can quite readily be obtained using electrostatic acceleration systems, in which the source of ions is held at a fixed voltage relative to the wafer to be implanted, the fixed voltage defining the energy of the ions in the beam on implantation.

It has been recognized that radio frequency linear accelerators are useful to achieve higher beam energies.

A linear accelerator structure accelerates charged particles of a specific mass/charge ratio which are injected into the accelerator at a specific injection energy. It is the inherent nature of rf linear accelerators that the particles or bunches of particles passing through the accelerator must reach successive accelerating gaps at the right region of the sinusoidal waveform of the voltage applied to the gaps. Essentially, as each particle (or bunch of particles) crosses an accelerating cavity it will receive a certain amount of energy (increase in speed) dependent on the field across the gap at the specific time. If an accelerator is set up for particles of a particular mass/charge ratio and injection energy, the particles accelerated by a first gap will reach the next accelerating gap just as the field across that gap is optimum to provide further acceleration. It will be understood by people skilled in this art that a particle of the same energy but having a higher mass-to-charge ratio crossing the first gap would travel from the first gap at a lower velocity and so would tend to reach the next gap later in the rf wave form that is applied across that gap. Similarly, a lighter particle crossing the first gap would reach the second gap earlier. The accumulated effect of this over multiple accelerating gaps is that particles of mass-to-charge ratios different from the mass-to-charge ratio for which the accelerator is set up arrive at subsequent accelerating gaps at times when they are not suitably accelerated.

As is well known in the linear accelerator art to produce high energy beams of different ionic species the set up of the accelerator requires change to match the mass-to-charge ratios of the selected ions. Among ions useful for implantation, singly charged boron ($B^+$) has a mass/charge ratio of about 11, whereas singly charged phosphorous ($P^+$) has a mass/charge ratio of about 31. Singly charged arsenic has a mass-to-charge ratio of about 75 and singly charged antimony has a mass-to-charge ratio of about 122.

The use of rf linear accelerators for ion implantation has been suggested at least since 1976 in "Upgrading of Single Stage Accelerators" by K. Bethge et al, pages 461–468, Proceedings of the Fourth Conference on the Scientific & Industrial Applications of Small Accelerators, North Texas State University, Oct. 27–29, 1976; and in "Heavy Ion Post-acceleration on the Heidelberg MP Tandem Accelerator", edited by J. P. Wurm, Max Planck Institute for Nuclear Physics, Heidelberg, May 1976. U.S. Pat. No. 4,667,111 discloses an ion implanter incorporating a radio frequency linear accelerator to provide ultimate beam energies as high as 2 meV or more. The rf linear accelerator is formed of a series of so called two gap accelerating cavities. For set up of the accelerator, with the frequency of the rf fields in successive cavities of the accelerator kept the same, the phase of the wave form for one two-gap cavity relative to the preceding two-gap cavity is adjusted so that the correct point of its waveform is presented to arriving ions of the selected species. The resulting two-gap tool tends to be very long relative to the performance achieved; the specification contemplates using ten or more two-gap cavities in succession, and is limited to relatively low beam currents. Whereas a low beam current may be satisfactory at high energies, when the apparatus is operating at relatively lower energies, higher beam currents are desirable to improve the processing speed.

Japanese Patent Application Publication No. Hei 9-237700 (1997) discloses an ion implanter using an rf accelerator formed with one or more three gap rf accelerator cavities. In this context it will be understood by those skilled in the art of linear accelerators that a two gap accelerator cavity, e.g. as used by the above referred U.S. patent, has entrance and exit electrodes at a fixed, usually ground, potential and a single intermediate electrode to which is applied the rf potential, thereby forming a pair of accelerating gaps on opposite sides of the rf electrode. As is also well known in the art, a three gap cavity has entrance and exit electrodes at a fixed, usually ground, potential and a pair of intermediate electrodes defining three gaps. The intermediate electrodes are energised by the rf potential with opposite polarity. Thus, if the amplitude of the energising rf voltage is V, the maximum accelerating potential across the first and last gaps of the cavity is V whereas the maximum accelerating potential between the two intermediate electrodes is 2V.

In the above Japanese publication, the injection energy to the three gap rf accelerator cavity appears to be relatively high. The specification contemplates some form of beam accelerator upstream of the three gap cavity but downstream of the usual analyser magnet, which separates from the ions emitted from an ion source the particular species of ion required for implantation. U.S. Pat. No. 5,801,488, which is assigned to the same Assignee as the above Japanese patent publication, discloses the provision of an rf quadrupole accelerator upstream of the three-gap linear accelerator stages.

Reference may also be made to Japanese Patent Publications Nos. Hei 7-57897 and Hei 7-57898 which disclose features of the same machine, and also to the article "The development of a beamline using an RFQ and three gap rf accelerators for high energy ion implanter", Fujisawa et el, presented at IIT, Kyoto, Jun. 24th 1998.

Generally, the above Japanese references disclose an implanter tool which is likely to be very large and expensive to build. Furthermore, beam currents when operating at relatively lower energies will be very small.

SUMMARY OF THE INVENTION

An object of the present invention is to provide an ion implanter using at least one rf accelerator stage, which can generate a high energy beam as well as operate at lower energies with good beam current.

Accordingly, in one aspect the invention provides an ion implanter comprising an ion beam generator for generating a beam of ions to be implanted in which said ions are at a first energy, and a radio frequency linear accelerator assembly arranged when energised for accelerating ions of said beam to a second energy, said assembly comprising electrodes defining a series of gaps for changing the energy of ions of said beam, said electrodes having apertures through which the ions pass, wherein the apertures of the electrodes defining the gaps of the accelerator assembly have respective first dimensions in a first orthogonal direction transverse to the beam direction and respective second dimensions in a second orthogonal direction transverse to the beam direction, said first dimension of the aperture of at least the first electrode defining the first gap being smaller than said second dimension of said first electrode aperture. The aperture of this first electrode may be slit shaped. With such an electrode aperture shape the smaller first dimension is effective to limit field penetration into the aperture. This is important to ensure the potential within the electrode aperture, even at the position of the central axis of the beam, is closely similar to the potential of the electrode. Excessive field penetration might otherwise necessitate making the electrode longer in the beam direction which would require a lower frequency rf voltage. Also, reducing field penetration can improve efficiency by increasing the so called "transit time factor" of the gaps of the accelerator. On the other hand, the larger second dimension can reduce the focusing effect of the field in said second orthogonal direction for ions passing through the electrode aperture in a beam having a width in said second orthogonal direction which is significantly less than said second dimension.

Apart from the first electrode of the assembly in the beam direction, the second electrode may also have an aperture with its first dimension smaller than its second dimension. Preferably, all the electrodes of at least a first cavity of the assembly will be so formed.

This structure, especially in combination with magnetic quadrupoles for beam focusing, will allow higher beam current through the accelerator assembly, not only when energised for accelerating beam ions, but also when operating in drift mode. In this context "drift mode" denotes operating the ion implanter with no rf voltage applied to any of the electrodes of the rf accelerator assembly, so that ions are implanted at the "first energy" or the energy of injection into the rf accelerator, or even lower energies if a deceleration system is provided.

In order to minimise the overall length of the linear accelerator assembly the assembly is preferably formed of at least one three gap linear accelerator stage. A linear accelerator formed of three gap cavities can be shorter overall for the same energy increment as will be provided by an equivalent accelerator formed of two gap cavities.

The invention also provides an ion implanter comprising an ion beam generator for generating a beam of ions to be implanted, in which said ions have a predetermined mass/charge ratio and an injection energy E, a three gap linear accelerator stage into which said beam of ions is directed at said injection energy, said stage being arranged when energised for accelerating ions of said beam to a second energy, said stage comprising an entrance electrode held at a fixed potential and an exit electrode held at a fixed potential, first and second radio frequency electrodes located in series between said entrance and exit electrodes, and a radio frequency generator to apply radio frequency voltages of opposite polarity and a predetermined frequency f respectively to said first and second electrodes, said entrance electrode and said first radio frequency electrode defining a first accelerating gap, said first and second radio frequency electrodes defining a second accelerating gap having a centre point at a first predetermined spacing $d_1$ from the centre point of the first gap, and said second radio frequency electrode and said exit electrode defining a third accelerating gap having a centre point at a second predetermined spacing $d_2$ from said centre point of the second gap, wherein the injection energy E, the frequency f, and the gap spacings $d_1$ and $d_2$, are selected such that, at amplitudes of the radio frequency energy below the maximum amplitude at which breakdown occurs across any of said gaps, injected ions of said beam which cross the first gap when the radio frequency field across the first gap is rising from a maximum deceleration field to a maximum acceleration field, then cross the second gap during the maximum acceleration field across the second gap and cross the third gap when the field across the third gap is falling from a maximum acceleration field to a maximum deceleration field.

According to classical practice in the operation of linear accelerators, the accelerator should be driven and structured so that bunches of ions passing along the length of the accelerator arrive at each accelerating gap at or shortly before the peak of the rf field across that gap which would produce maximum acceleration. By arriving shortly before the peak, the variation in field strength experienced by ions in the bunch arriving at different times tends to provide greater acceleration to ions arriving late in the bunch, and less acceleration to ions arriving first in the bunch. Thus, the bunching tendency is maintained as the ions pass through the accelerator.

It has been found, however, that there are significant advantages in operating a three gap accelerator stage so that ions arriving at the first gap before the point of maximum acceleration field across the first gap, reach the second gap during maximum acceleration field and cross the third gap after the point of maximum acceleration field. Setting up the accelerator stage in this way maximises the acceptance of ions from the beam injected into the accelerator. Energy spread introduced to the ions crossing the first gap tends to be removed again as the ions cross the third gap. As a result, the accelerator stage can accept ions crossing the first gap over a greater spread of rf phase angles, for a desired percentage spread in the energies of ions leaving the stage. If the spread of energies introduced by the first gap is effective to reduce the spread in phase of the ions by the time they reach the third gap, the third gap may not so effectively remove the energy spread. However, such ions would also have reduced spread in phase when crossing the second gap, so that the energy spread introduced by the second gap would be reduced. The overall effect would be a similar reduction in overall percentage energy spread in the ions leaving the accelerator stage.

Importantly, also, such an arrangement allows the stage to be used with different applied radio frequency voltage amplitudes. Reducing the rf amplitude from the maximum has the effect of reducing the energy increment delivered to the beam ions passing through the stage. Importantly, by constructing the accelerator stage to operate in the way described above, the proportion of injected ions passing through the accelerator stage and accelerated to the target energy is maintained over a wide range of applied rf voltages. This allows the accelerator stage to be operated for delivering a range of energy increments to the injected ion beam while still maintaining good beam current in the accelerated beam.

This is especially important for ion implantation where it is crucial that ions are delivered to the target substrate at a reasonably well defined energy. Excessive energy spread in ions accelerated by an rf linear accelerator stage would result in fewer ions in the beam having the required target energy, thereby reducing the effective beam current at the required energy on the target substrate.

The invention still further provides a method of implanting ions into a target substrate comprising the steps of generating a beam of the ions at a first energy, and changing the energy of ions in the beam to a second energy using a radio frequency (rf) linear accelerator assembly having at least first and second booster stages in tandem along the beam direction, each of the booster stages comprising entrance and exit electrodes and at least one intermediate rf electrode defining a series of gaps for changing the energy of ions of said beam, the exit electrode of the first booster stage and the entrance electrode of the second booster stage defining between them a drift distance between the stages over which beam ions are not subject to rf fields, wherein the speed of the bunches of ions from the first booster stage over said drift distance to the second booster stage, and thus the flight time, is adjusted, while locking the phase of the field at each stage to a respective fixed value. This provides a very simple and convenient method of controlling the arrival time of the bunches of ions at the second stage of the linear accelerator. As a result, rf acceleration is used for accelerating ion species over a range of mass to charge ratios to energies useful for high energy ion implantation without having to resort to the complication of independently varying the phases of the two booster stages.

One way of achieving this is by adjusting the amplitude of the rf fields in the first booster stage, thereby adjusting the energy, i.e. speed, of the bunches exiting the first booster.

In particular, the set up of the linear accelerator may be changed from accelerating a beam of ions of a first mass/charge ratio to accelerating a beam of ions of a second mass/charge ratio by changing ion speed over the drift distance while maintaining the respective phases of the rf fields in the first and second booster stages locked. In this way the set up of the accelerator can easily be changed for accelerating ions of different mass charge ratios.

Preferably, the drift distance is greater than the length of the first booster stage between the entrance and exit electrodes thereof. Then, a relatively modest change in the speed (energy) of the bunches of ions exiting the first booster stage can have a substantial effect on the time of arrival of the bunches at the second booster stage.

In a further aspect, the present invention provides an ion implanter comprising an ion beam generator for generating a beam of ions to be implanted, in which said ions are at a first energy, and a radio frequency (rf) linear accelerator assembly arranged, when energised, for accelerating ions of said beam to a second energy, said assembly comprising at least first and second resonant cavities in tandem along the beam direction, said cavities comprising electrodes defining a series of gaps for changing the energy of ions of said beam, a rf power supply to provide a first supply of rf energy at a first frequency to said first cavity, said first cavity being resonant at said first frequency, whereby to produce corresponding first rf accelerating fields between electrode gaps in said first cavity, said first fields having a phase and an amplitude, said rf power supply providing a second supply of rf energy at a second frequency, which is the same as or a harmonic of said first frequency, to said second cavity, said second cavity being resonant at said second frequency, whereby to produce corresponding second rf accelerating fields between electrode gaps in said second cavity, said second fields having a phase and an amplitude, and a controller arranged to adjust the time of flight of bunches of ions from the first cavity to the- second cavity by adjusting the amplitude of said first accelerating fields in said first cavity, while maintaining locked to fixed values the phases of said first and second fields.

There follows by way of example only a description of a preferred embodiment of the invention.

BRIEF DESCRIPTION OF THE DRAWINGS

FIG. 4A is a drawing from one side of the rf electrodes of the first stage of the rf accelerator assembly of FIG. 2.

FIG. 4B is a cross-sectional view of one of the electrodes taken along line A—A in FIG. 4A.

FIG. 4C illustrates one of the aperture plates forming the aperture of one of the electrodes of FIG. 4A.

FIG. 4D is a cross-sectional view of the aperture plate of FIG. 4C taken along line B—B.

FIGS. 10A and 10B are interior and cross-sectional views respectively of a pick up loop assembly used in the resonant chambers of FIG. 7.

FIGS. 11A and 11B are side and cross-sectional views respectively of an adjustable tuning capacitor used for tuning the resonant frequency of the resonant chambers of FIG. 7.

DESCRIPTION OF THE PREFERRED EMBODIMENTS

Figure 1:
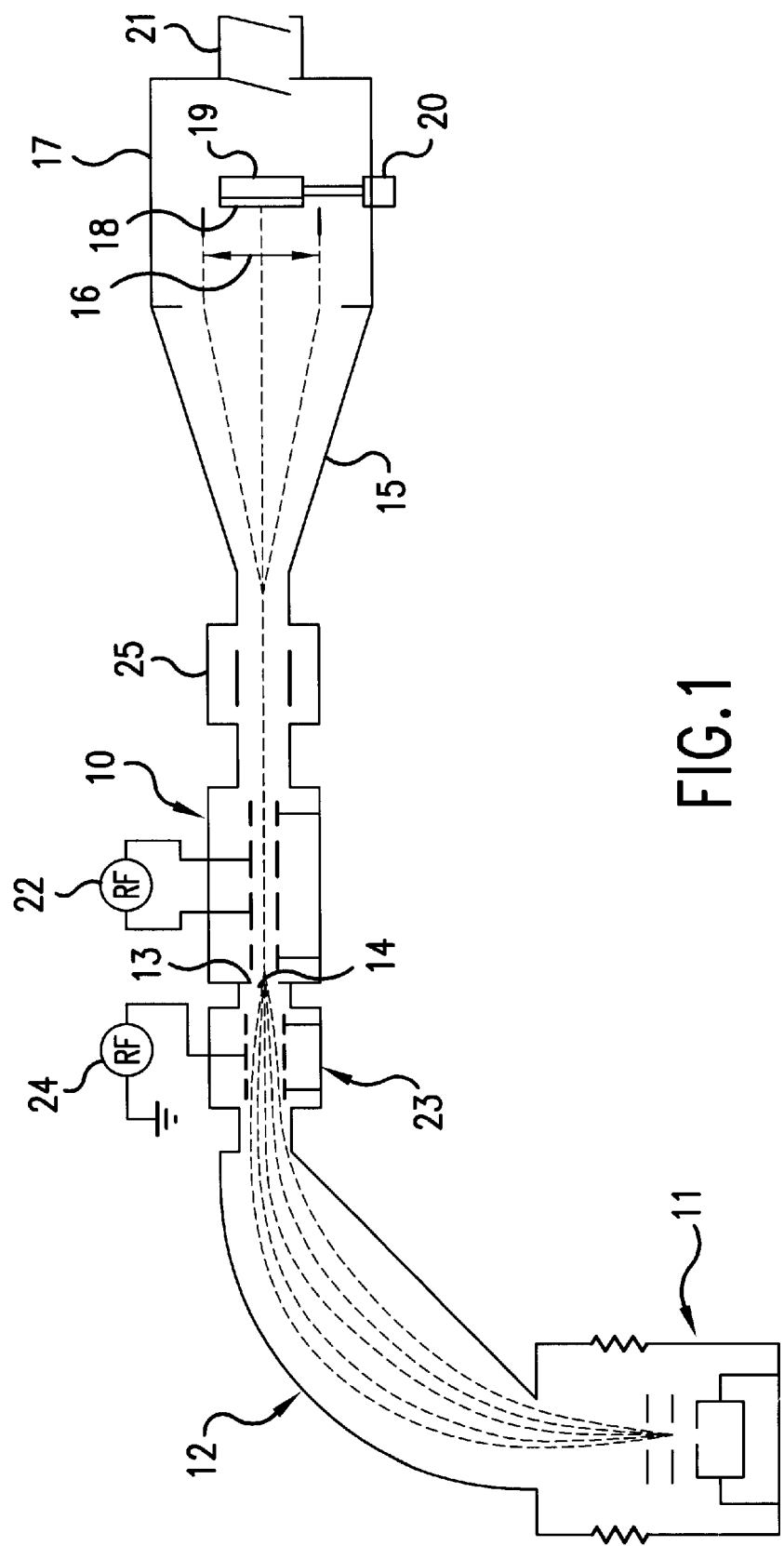
FIG. 1 is a schematic plan view of an ion implanter which may embody the present invention.

Aspects of the invention may be employed in many different kinds of ion implanters, including both implanters designed for simultaneously processing a batch of wafers, and single wafer implanters designed for processing single wafers one after the other. FIG. 1 illustrates schematically a single wafer implanter incorporating a radio frequency linear accelerator assembly 10. In the simplified arrangement of FIG. 1, the implanter comprises an ion source 11 directing a beam of ions at a predetermined energy E into an analyser magnet 12. Only ions of the required velocity times mass/charge (m/e) ratio pass through a mass selection slit 13 at the exit of the analyser magnet 12, and enter as a beam 14, still at energy E, into the radio frequency accelerator assembly 10. The beam exiting the rf accelerator assembly 10 then enters a beam scanning device 15 which is arranged to scan the ion beam to and fro in a direction 16 transverse to the beam direction. The scanning device 15 may be either electrostatic or electromagnetic. Electromagnetic scanning systems are preferred in applications especially for high current beams. A suitable electromagnetic scanning system is disclosed in U.S. Pat. No. 5,393,984. The scanned beam then enters a process chamber 17 in which a semiconductor substrate 18 is held on a holder 19. The holder 19 is mounted on a mechanical scanning mechanism shown generally at 20 which can be actuated to reciprocate the wafer in a direction normal to the plane of the paper in FIG. 1 and across the plane of the scanned beam. The combination of scanning of the beam and mechanical scanning of the wafer holder 19 allows the beam to scan over all parts of the wafer during an implant process. Processed wafers are removed from the holder 19 and passed out of the process chamber 17, and fresh wafers for processing are brought into the chamber 17 and mounted on the holder 19 one at a time, via a load lock 21, and using robot handling mechanisms which are not shown in this drawing for simplicity.

Further details of single wafer implanters can be determined from U.S. Pat. Nos. 5,003,183 and 5,229,615, and of a preferred form of process chamber from International Patent Application WO 99/13488. The specific details of the ion source, the mass selection magnet and the scanning and processing mechanisms of the implanter are not crucial to aspects of the present invention, which concern solely the arrangement of an rf accelerator assembly which may be used to increase the energy of ions in implanters such as disclosed in the above prior art documents.

It should be understood that the invention is equally applicable to batch implanters, which typically rely solely on mechanical scanning to process a batch of semiconductor wafers simultaneously. The wafers are usually mounted around the periphery of a rotating wheel, which rotates to bring the wafers one by one across the line of the ion beam. Meanwhile, the axis of rotation of the wheel is reciprocated to and fro to complete the scanning in the orthogonal direction.

The earlier referred U.S. Pat. No. 4,667,111 describes such a batch type implanter. Reference may also be made to U.S. Pat. No. 5,389,793 for further details of a typical batch type implanter.

Referring again to FIG. 1, the rf accelerator assembly 10 is schematically illustrated in the form of a three gap accelerator stage in which an rf voltage of opposite polarity is applied from a source 22 to respective ones of the two centre electrodes. Further details of the construction and design of the accelerator assembly will be apparent from the following description.

It should be noted also that a buncher 23 would normally be incorporated in front of the accelerator assembly 10 to form and deliver bunches of ions at the injection energy to the accelerator to increase the proportion of ions from the unbunched beam which may be accelerated by the accelerator assembly. Such bunchers are known, and generally produce a controlled energy spread in beam ions so that the ions become physically bunched on entry into the accelerator assembly. Known bunchers are designed to capture for bunching a maximum proportion of unbunched beam ions, without providing any overall increase in average energy to the bunched ions. In FIG. 1, the buncher 23 is illustrated as a two gap device having a central electrode energised from an rf supply 24. The purpose and operation of bunchers is described in Theory of Linear Accelerators, by A. D. Vlasov, Chapter 2.5, published in English translation in 1968.

It should also be noted that the rf accelerator assembly 10 would normally be followed, along the beam direction, by an energy filter, illustrated generally in FIG. 1 at 25. The use of such an energy filter following an rf accelerator in ion implanters is well known, see for example "Production of High Energy Ion Implanters Using Radio Frequency Acceleration" by Glavish et al, Nuclear Instruments and Methods in Physics Research, B21 (1987) 264–269. The energy filter is used to limit the range of energies of ions from the accelerator which proceed to be implanted in the semiconductor substrate.

The energy filter may take any known form such as an electrostatic inflector or an analyser magnet.

Figure 2:
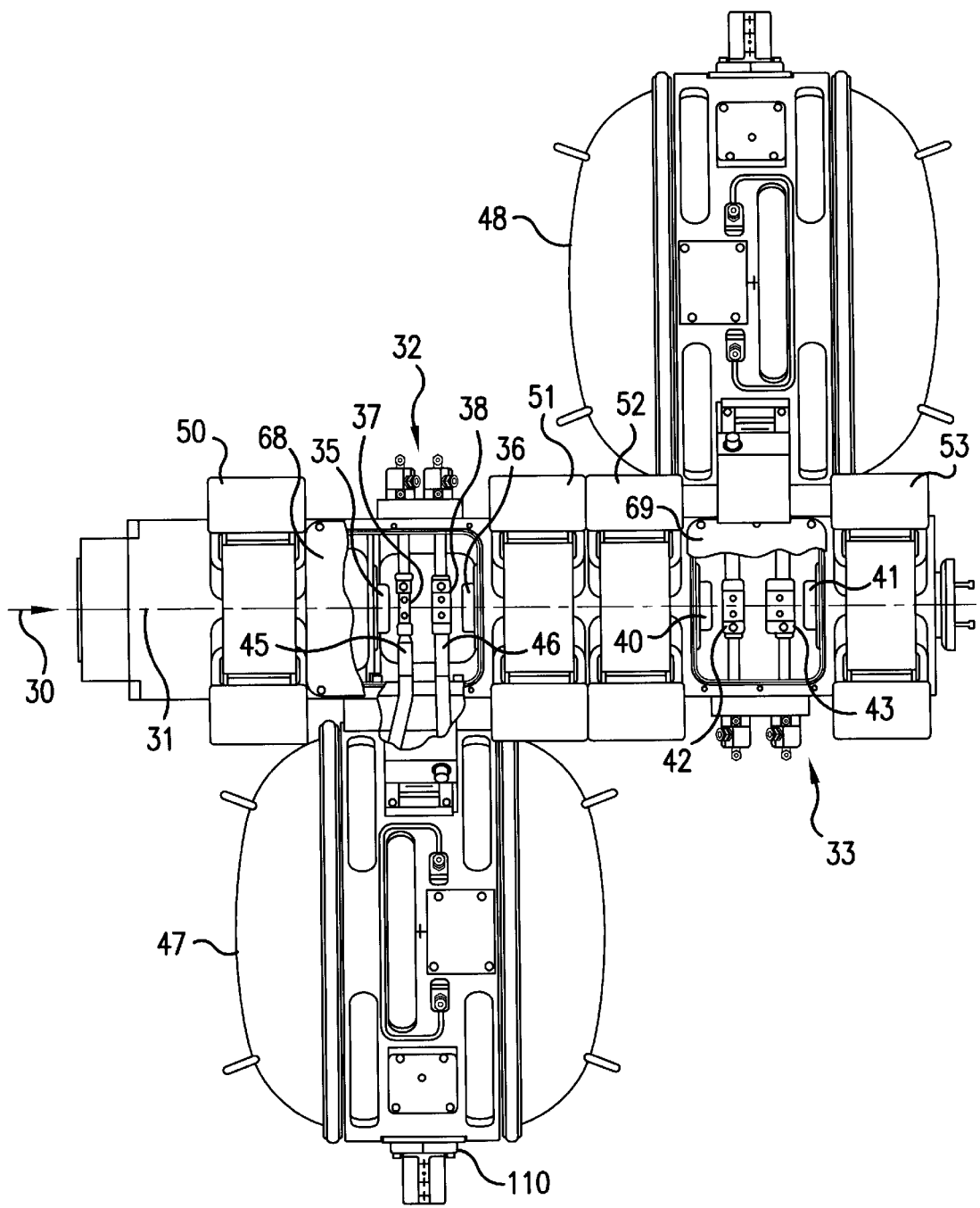
FIG. 2 is a drawing in elevation of an rf linear accelerator assembly which may be employed in the ion implanter of FIG. 1.

FIG. 2 illustrates a preferred embodiment of rf accelerator assembly such as may be incorporated as the assembly 10 in the ion implanter of FIG. 1. In FIG. 2, the ion beam from the analyser magnet enters from the left in the direction of arrow 30 and passes through the accelerator generally along the line of axis 31.

The accelerator is formed of two three gap rf booster cavities in tandem and illustrated generally at 32 and 33. Whilst FIG. 2 is generally a view of the accelerator assembly in elevation, parts of the outer walls of the vacuum chamber of the assembly have been broken away to reveal the location of the electrodes of the two acceleration stages represented by the cavities 32 and 33.

Accordingly, cavity (or stage) 32 has an entrance electrode 35 and an exit electrode 36. Each of the entrance and exit electrodes 35 and 36 are mounted to the walls of the vacuum chamber of the assembly and are therefore held at the same constant potential, usually ground potential. Between the electrodes 35 and 36 are first and second rf electrodes 37 and 38. The electrodes 37 and 38 are mounted to be electrically insulated from the walls of the vacuum chamber, and it can be seen that the four electrodes 35 to 38 between them define three successive gaps along the beam direction 30. As will become apparent, each of the electrodes 35 to 38 defines an aperture on the axis 31 through which the beam can pass. As will be explained later herein, as the beam travels across the gaps between the electrodes, ions in the beam are accelerated by an rf field in the gaps produced by rf voltages applied to the electrodes 37 and 38.

The second accelerator stage 33 has a similar construction with entrance and exit electrodes 40 and 41 and intermediate rf electrodes 42 and 43, defining between them three accelerating gaps along the beam direction 30. Each of the electrodes 37 and 38 of the accelerator stage 32 is connected to a respective conductor 45 and 46 which leads out of the chamber enclosing the ion beam and into a resonant tank chamber 47. Inside the tank chamber 47, the conductors 45 and 46 are formed as coils and connected to ground. The combination of the electrodes 37 and 38, the coils in the tank chamber 47, the grounded metal components of the vacuum chamber surrounding the electrodes 37, 38 and the tank chamber 47 itself, which is also connected to ground, forms a resonant tank circuit which is designed to be resonant at a desired operating frequency of the accelerator, typically in the range 10 to 50 MHZ. In the present embodiment, the operating frequency is about 20 MHZ.

In the present embodiment, the interior of the resonant tank chamber 47 is open to the interior of the vacuum chamber containing the electrodes 37 and 38, so that the interior of the tank chamber 47 is also at a vacuum.

The electrodes 42 and 43 of the second accelerator stage 33 are similarly connected by conductors to coils within a similar resonant tank chamber 48. The tank circuit formed by the chamber 48 and the electrodes 42 and 43 is similarly arranged to have the same resonant frequency as the first resonant cavity 32.

In operation, rf power is supplied to the resonant circuits formed by the cavities 32 and 33 with associated tank chambers 47 and 48, so that the rf electrodes 37, 38 and 42, 43 are energised with opposite polarity at the resonant frequency. As will be explained in more detail later herein, bunches of ions from the ion beam along the axis 31 are then accelerated as they traverse the gaps between the electrodes in the two resonant cavities so as to emerge from the accelerator assembly with increased energy.

FIG. 2 also illustrates the location of magnetic quadrupoles along the beam axis 31 at 50, 51, 52 and 53. Magnetic quadrupoles are used, as is known to skilled workers in this field, to control expansion of an ion beam and bring the beam back to a required focus or waist. The magnetic quadrupoles 51 to 53 are used to control the expansion of the beam as it passes through the rf accelerator.

Figure 3A:
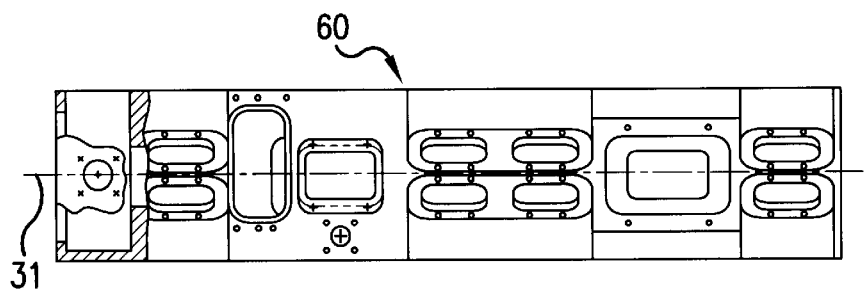
FIGS. 3A and 3B are top and side views respectively of a unitary block forming the core of the accelerator assembly of FIG. 2.
Figure 3B:
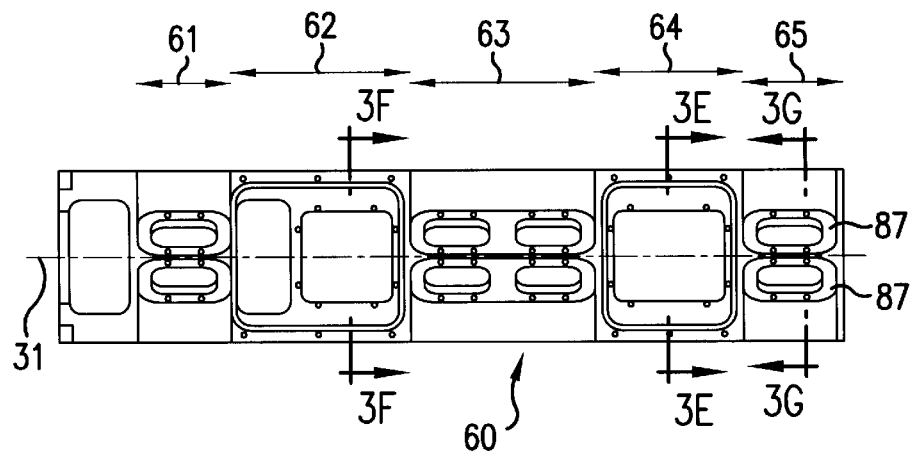
Figure 3C:
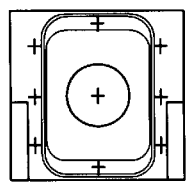
FIGS. 3C and 3D are respective end views of the block of FIGS. 3A and 3B.
Figure 3D:
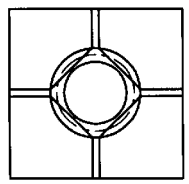
Figure 3E:
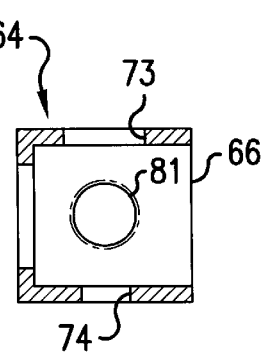
FIGS. 3E, 3F and 3G are cross-sectional views taken through the block of FIGS. 3A and 3B along section lines C—C, F—F and D—D respectively.
Figure 3F:
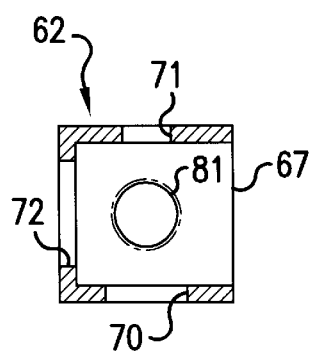

The rf accelerator assembly of FIG. 2 is constructed using a unitary block of metal as illustrated at 60 in FIGS. 3A and 3B. FIG. 3A shows the basic unitary block 60 from above, corresponding to the top in FIG. 2, and FIG. 3B is a corresponding view from the side, corresponding to the elevational view of FIG. 2. The block 60 is essentially divided along its length, corresponding to the axis 31, into five segments 61, 62, 63, 64 and 65. Segments 62 and 64 have essentially a square cross-section as illustrated in FIGS. 3E and 3F which are sectional views taken along the lines C—C and F—F of FIG. 3B. In each case, the front face 66, 67 of the respective segments 62, 64 is open in the assembled structure, these faces are closed by inspection hatches which can be partly seen at 68 and 69 in FIG. 2. The lower face of the segment 62 has an opening 70 to receive the conductors 45 and 46 extending into the interior of the segment 62 from the associated resonant tank chamber 47 of the assembly. An upper face of the segment 62 has a smaller opening 71 for receiving the insulating mounting structure of the rf electrodes to be assembled within the segment 62. A rear face of the segment 62 has a further opening 72 which can be connected to a pumping port for evacuating the interior of the assembly.

The segment 64 has essentially the same construction except that the upper face has an opening 73 for communicating with the associated tank chamber 48 and the electrode insulators are mounted in an aperture 74 in the lower face.

Figure 3G:
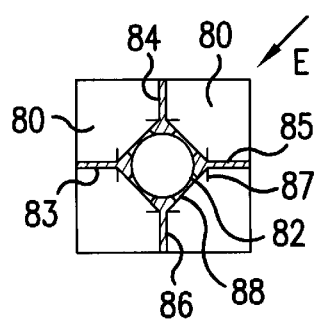
Figure 3H:
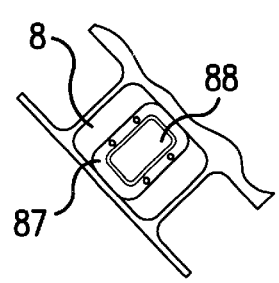
FIG. 3H is a view of the end part of the block of FIGS. 3A and 3B taken in the direction of the arrow E as illustrated in FIG. 3G.

The segments 61, 63 and 65 of the block 60 have a cross-sectional shape as illustrated in FIG. 3G which is a section taken along lines D—D of FIG. 3B. The shape is also illustrated in FIG. 3H which is a view of the segment 65 of the block 60 taken in the direction of arrow E in FIG. 3G.

In FIG. 3G, the surfaces 80 comprise an end wall of the square section segment 64 immediately adjacent to the segment 65. Thus each of the segments 62 and 64 are closed, in planes perpendicular to the axis 31, leaving only a central circular aperture between the respective segments 62, 64 and the adjacent segments 61, 63, 65. These circular apertures are illustrated at 81 in FIGS. 3E and 3F and at 82 in FIG. 3G.

In each of the segments 61, 63 and 65, the block 60 has webs 83, 84, 85 and 86 extending in radial planes parallel to the axis 31 midway between the corners of the adjacent square section segments 62, 64. The inner edges of the webs 83, 84, 85 and 86 are formed so that pairs of adjacent webs form a sealing surface 87 surrounding an aperture 88, between each pair of adjacent webs. These apertures 88 are used to receive the poles of magnetic quadrupoles 50, 51, 52 and 53 mounted on the block 60. The construction of these magnetic quadrupoles in relation to the block 60 will be described in more detail later herein.

The segment 61 is substantially the same as segment 65, providing single apertures corresponding to aperture 80 at four positions around the block. However the segment 63 is essentially twice the length of the segments 61 and 65 and provides pairs of apertures corresponding to apertures 88 spaced along the axis 31, at each of the four positions around the block between adjacent webs.

FIGS. 4A to 4D illustrate the construction of the rf electrodes 37 and 38 of the first rf accelerator cavity 32. Each of the electrodes 37 and 38 is mounted on a respective insulating post 90, 91 extending from a mounting block 92. As can be seen from FIG. 4B, which is a cross-sectional view along lines A—A of FIG. 4A, the post 91 is aligned and secured to the mounting block 92 by means of a set screw 93 which presses a precision ball, sliding in a cylindrical bore of the same diameter as the ball, into a conical dimple in the post 91. The electrode 38 is aligned and secured to the other end of the post 91 by means of a similar set screw 94 and associated precision sliding ball. The post 91 is typically made of alumina. The outer end 95 of the post 91 is sealed in a small bell housing 96 so as to leave a cavity 97 between the end 95 of the post and the interior of the bell housing 96. Cooling fluid can be directed through the cavity 97 by means of fluid junctions 98 and 99. This provides a heatsink at the inner end 95 of the post 91 which is sufficient to cool the electrode 38.

The electrode itself comprises a yoke 100 which receives the end of the mounting post 91. An aperture 101 is formed through the yoke 100. An aperture plate 102 as illustrated in FIGS. 4C and 4D, is secured by means of clamping plates 103, to cover each face of the yoke 100. The aperture plates 102 have an aperture opening 104 which, when the aperture plates are in position on the opposite faces of the electrode 38, align with the aperture 101 of the yoke 100 of the electrode and are effective to define the aperture opening of the electrode. The clamping plates 103 are secured to the yoke 100 by means of securing screws 105.

The aperture plates 102 may be formed of graphite or aluminium and are designed to be replaceable in the event of excessive erosion or corrosion by the ion beam passing through the aperture of the electrode.

The yoke 100 includes a short bore 106 formed in an end of the yoke opposite to the end receiving the insulating post 91. This bore is provided to receive the conductor 46 (FIG. 2) extending from the tank chamber 47 to energise the electrode 38. The interior of the bore 106 is shaped to receive a compressible cylindrical element, which allows a good ohmic contact to be made at the required radio frequency between the yoke 100 of the electrode and the conductor 46 when received in the bore 106.

As can be seen in FIG. 4A, electrode 37 has the same essential structure as that described above for electrode 38. However, the electrode 37 has a length, in the direction of the beam, which is less than that of the electrode 38. A skilled worker in this field will appreciate that electrode lengths tend to increase along a linear accelerator as particle speeds increase, to provide increased path length to accommodate the increased particle speed.

The electrodes of FIG. 4 are mounted through the aperture 71 (FIG. 3F) of block 60 so as to take up the position as shown in FIG. 2, with the conductors 45, 46 from the associated tank chamber 47 received in the bores 106 of the electrodes.

As will become apparent from the subsequent description of the form and mounting of the coils within the tank chamber 47, the conductors 45 and 46 are themselves mounted only from points at the bottom end of the tank chamber 47, illustrated at 110 in FIG. 2. The conductors 45 and 46 are arranged to have a sliding fit in the bores 106 of the electrodes 37 and 38 so that thermal expansion of the conductors 45, 46 can be accommodated in the sliding connection in the bores 106, without applying stress or in anyway altering the position of the electrodes 37 and 38 which are held in position solely by the posts 90 and 91 from the mounting block 92 secured to the block 60 of the accelerator assembly.

The conductive sleeves mounted in the bores 106 to ensure good rf ohmic contact are in the form of louvred compressible cylindrical strips and are known by the trade name "Multi-Lam".

Figure 5A:
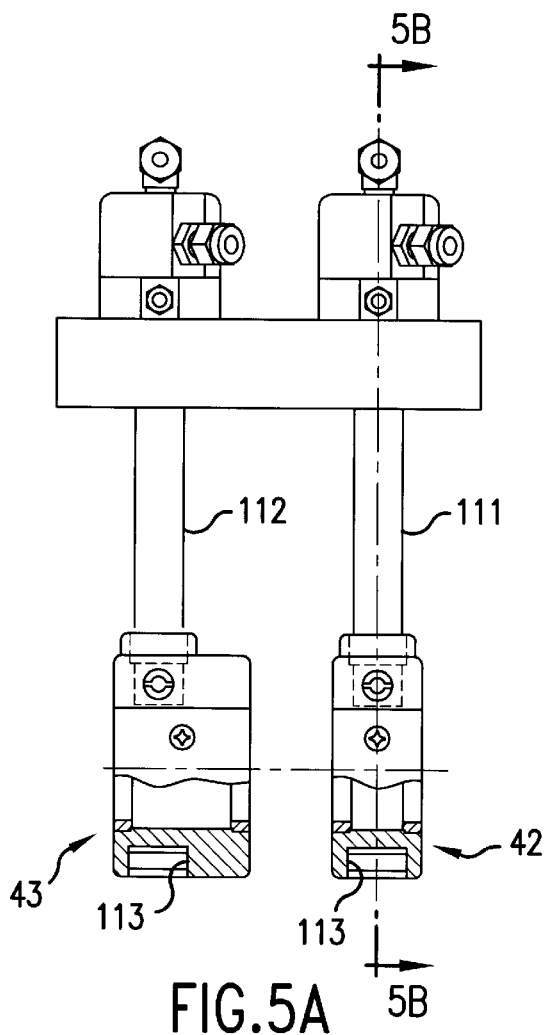
FIG. 5A is a side view of the rf electrodes of the second stage of the rf accelerator assembly of FIG. 2.
Figure 5B:
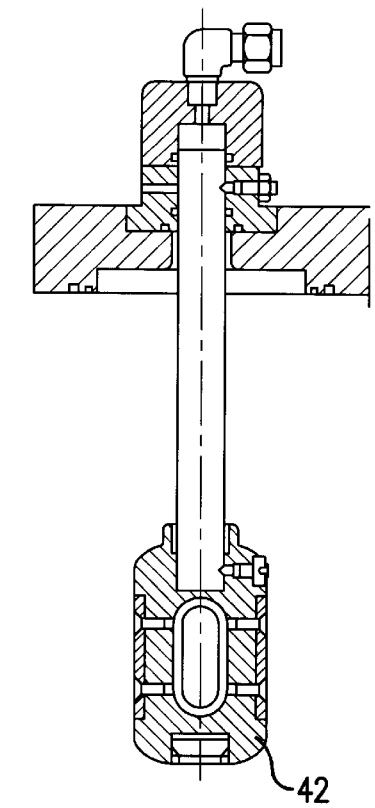
FIG. 5B is a cross-sectional view of one of the electrodes of FIG. 5A taken along line G—G.

FIGS. 5A and 5B illustrate the electrode assembly of the second resonant cavity 33. It should be noted that the assembly is illustrated from the opposite side compared to FIGS. 4A and 4B, so that the beam is shown passing through the electrodes 42 and 43 from right to left in FIG. 5A. Also, the electrode assembly of FIG. 5A is shown inverted (up side down) relative to the installation in FIG. 2.

In other respects, the electrode assembly of FIGS. 5A and 5B is substantially identical in construction to that of electrodes 37 and 38 illustrated in FIGS. 4A, 4B, 4C and 4D. The spacing between supporting posts 111 and 112 for electrodes 42 and 43 is slightly greater to accommodate the additional length of the electrodes, especially the downstream rf electrode 43.

The electrode assembly of FIG. 5A is mounted in the block 60 through the aperture 74 of FIG. 3E, and the conductors from the coil in the associated tank chamber 48 are received in bores 113 of the electrodes 42 and 43 in a manner similar to that for the electrode assembly of FIGS. 4A and 4B.

Figure 6A:
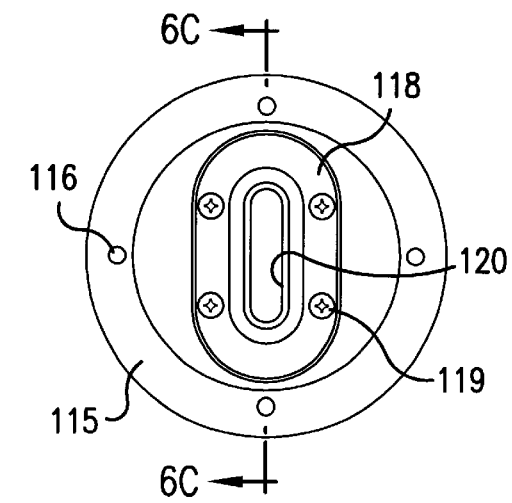
FIGS. 6A and 6B are front and side views respectively of the entrance electrode of the first stage of the accelerator assembly of FIG. 2.
Figure 6B:
Figure 6C:
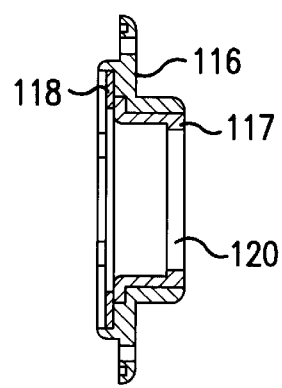
FIG. 6C is a cross-sectional view of the entrance electrode of FIG. 6A taken along line H—H.

The entrance electrode 35 of the first accelerator stage 32 is illustrated in FIGS. 6A, 6B and 6C. The electrode is mounted in a wall of the block 60 extending radially across the block, by means of mounting flange 115 secured by screws 116. The aperture of the electrode 35 is defined by a liner 117 which is replaceable by removing a clamping plate 118 secured to the flange by screws 119. The liner 117 may be made of graphite or aluminium and defines an aperture 120 through the electrode.

The exit aperture 36 of the first stage 32 as well as the entrance and exit apertures 40 and 41 of the second stage 33 are constructed in a similar fashion.

As can clearly be seen in each of FIGS. 4, 5 and 6, the apertures of the electrodes used for the two stages 32 and 33 of the accelerator assembly are not circular. In particular, the aperture of the entrance electrode of the first stage 32 has a major dimension which is more than four times the minor dimension transverse to the beam path through the electrode. The apertures through the rf electrodes have a major dimension which is about three times the minor dimension of the aperture.

In all cases, the major dimensions of the apertures of all electrodes are aligned vertically, in the plane of the paper in the drawing of FIG. 2. In this way, the electrodes can best accommodate the beam of ions of required mass from the analyzer magnet 12 as will be further explained later herein. On the other hand, by restricting the minor dimension of the apertures to make these as small as possible, field penetration into the region encompassed by the respective electrode is reduced. As a result, the overall length of the accelerator assembly can be kept to a minimum and the transit time factor for the accelerator can be maximized. Further, the total open area of the apertures through the electrodes is maintained relatively large to accommodate a substantial beam current, both during operation of the rf accelerator, and also during low energy drift mode operation of the implanter when the rf accelerator is not energized.

Figure 7B:
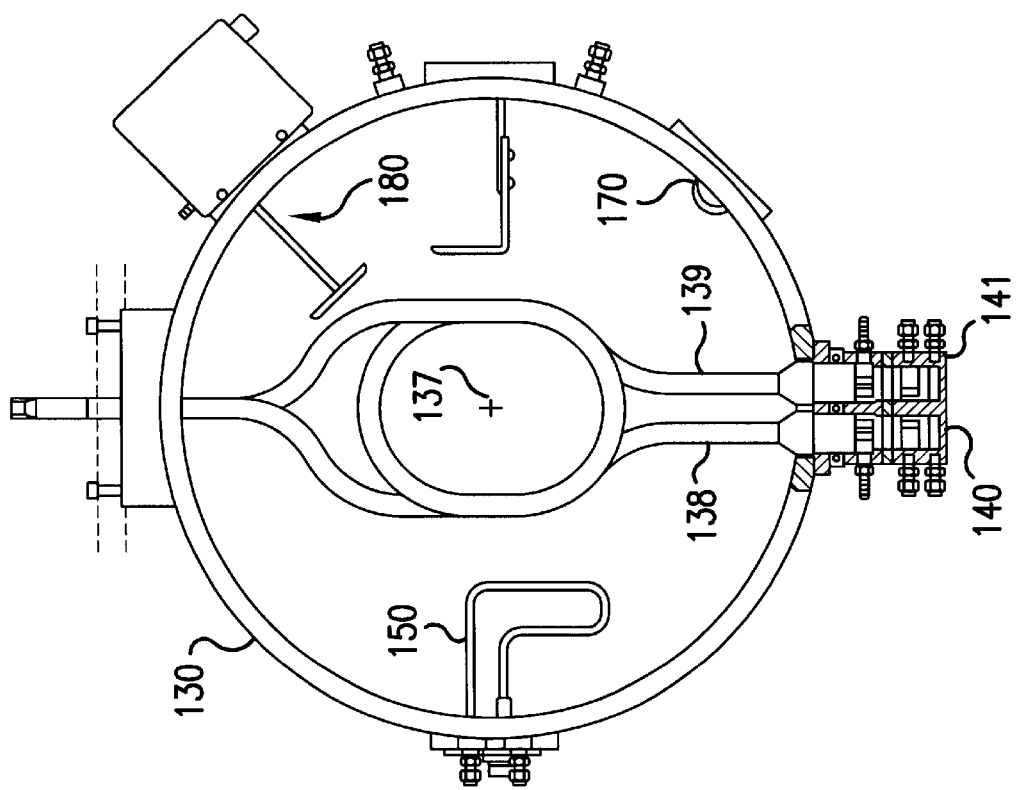
FIGS. 7A and 7B are side and end views respectively of the two coil assembly and resonant chamber for one of the stages of the accelerator assembly of FIG. 2.
Figure 7A:
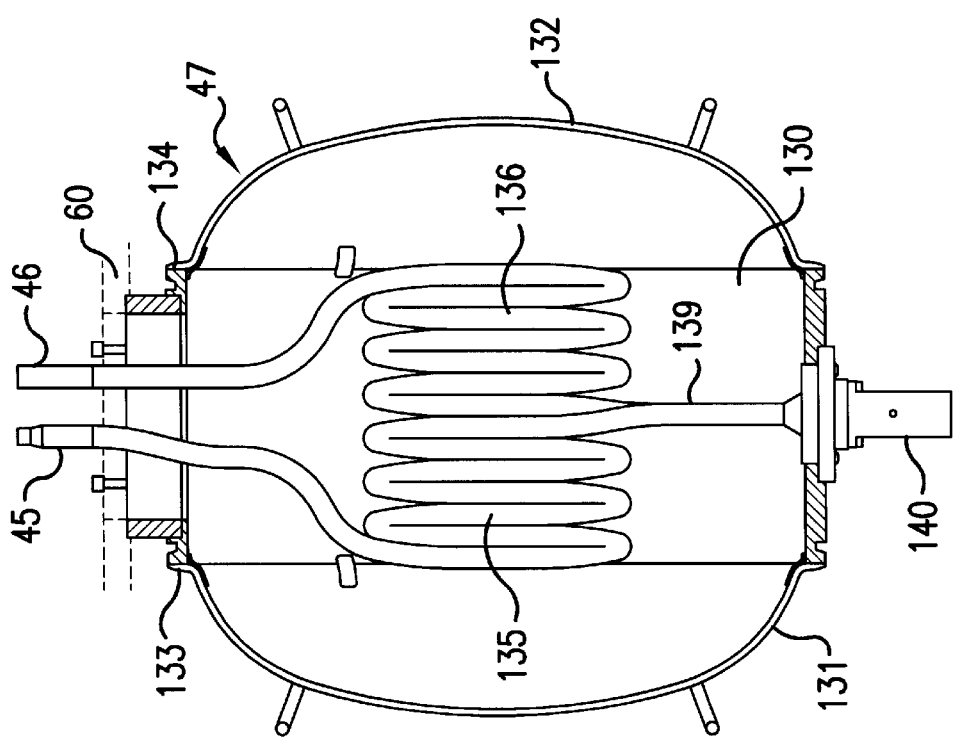

FIG. 7A is a cross-sectional view of the tank chamber 47, and FIG. 7B is a corresponding cross-sectional view of the tank chamber of FIG. 7A from one side.

The tank chamber 47 comprises a central cylindrical part 130 and two opposed domed closure parts 131 and 132. The domed closures 131 and 132 are sealed to the ends of the cylindrical part 130 by vacuum seals 133 and 134. These vacuum seals extend circumferentially around the ends of the cylindrical part 130 and enable the domed closures 131 and 132 to be removed for servicing and inspection of the interior of the tank 47.

Inside the tank 47, the conductors 45 and 46 form respective coils 135 and 136 which are aligned so as to be coaxial on an axis 137, which is essentially coincident with the axis of the cylindrical part 130 of the tank chamber 47. The opposite ends of the coils 135 and 136 extend down to form respective first connecting arms 138 and 139 to respective mounting points 140 and 141.

The conductors 45 and 46 and coils 135 and 136 are formed of lengths of hollow copper pipe. The weight of the coils 135 and 136 is essentially supported by means of the lengths 138 and 139 from the connection points 140 and 141. The upper ends of the conductors 45 and 46 form respective second connecting arms extending through an aperture in the cylindrical part 130 of the tank chamber 47 and through a corresponding aperture 70 in the block 60 of the accelerator assembly. As described previously, the ends of the second connecting arms 45 and 46 are received in bores 106 in the electrodes 37 and 38 and form a sliding fit with these electrodes. Thus, variations in tolerance in the manufacture of the coils 135 and 136 can be accommodated in the connection with the associated electrodes 37 and 38 without applying stress to the mountings of these electrodes or affecting the positional accuracy of the electrodes. Furthermore, any thermal expansion of the coils 135 and 136 can be accommodated in the sliding connections with the electrodes without distorting the coils.

The tank chamber 48 for the second accelerator stage 33 is constructed in a manner substantially identical to chamber 47 as illustrated in FIGS. 7A and 7B.

As mentioned previously, each of the coils 135 and 136 in the tank chamber is connected to ground at the mounting point 140 and is connected at the other end to the respective electrode 37 and 38. The combination of the capacitance between the electrodes and coils and the associated conducting surfaces of the vacuum chamber and the tank chamber, together with the inductance of the coils provides a resonant tank circuit. The resonant tank circuit is designed to have a resonant frequency at the required rf of the accelerator assembly and to have a very high quality factor so that a high amplitude rf voltage can be generated on the electrodes 37 and 38 with minimum ohmic power losses. It will be appreciated that the coils 135 and 136 are wound with the same hand and yet are inductively coupled, so that the rf voltages on the two electrodes 37 and 38 have opposite polarity at the lowest resonant frequency of the tank circuit.

Rf energy is coupled to the tank circuit by means of a coupling loop 150 (FIG. 7B). This coupling loop is illustrated in greater detail in FIGS. 8A and 8B. The coupling loop comprises a single loop of conductor 151 having one end connected to ground at 152, and the other end connected to a vacuum feedthrough 153. The vacuum feedthrough 153 enables electrical connection to be made to the end of the loop 150 from outside the vacuum chamber.

Figure 8B:
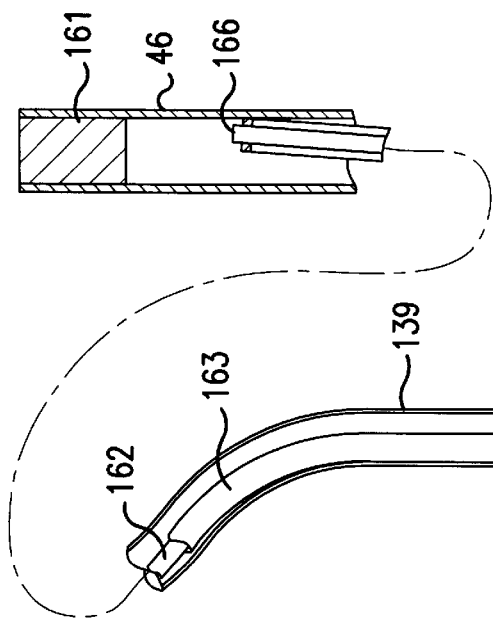
FIGS. 8A and 8B are sectional and outside views of the coupler assembly for coupling rf energy to the resonant chamber of FIG. 7.
Figure 8B:
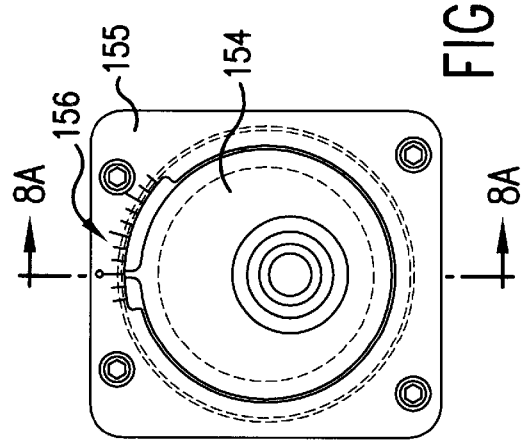
Figure 8A:
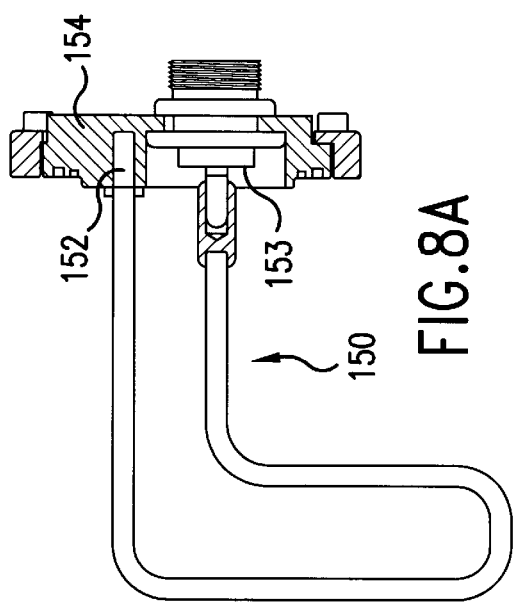

The loop as a whole is mounted on a disc 154 which is in turn mounted for rotary movement in a mounting plate 155 (see FIG. 8B). Adjusting the rotational position of the disc 154 over a range of angles can provide corresponding adjustment of the angular position of the loop 151 relative to the tank chamber 47 and the coils 135 and 136. The angular position of the loop 151 may be adjusted in order to provide satisfactory coupling and impedance matching of rf energy into the tank circuit.

An angle telltale 156 is provided on the external face of the mounting plate 155, so that the angular position of the loop 151 can be recorded for future reference.

Generally, the level of rf current generated in the coils 135 and 136 in order to provide the required rf potential at the electrodes 37 and 38, is sufficient to generate substantial heating of the coils 135 and 136 and the remaining lengths of the conductors 45 and 46. Accordingly, the conductors are water cooled.

Figure 9:
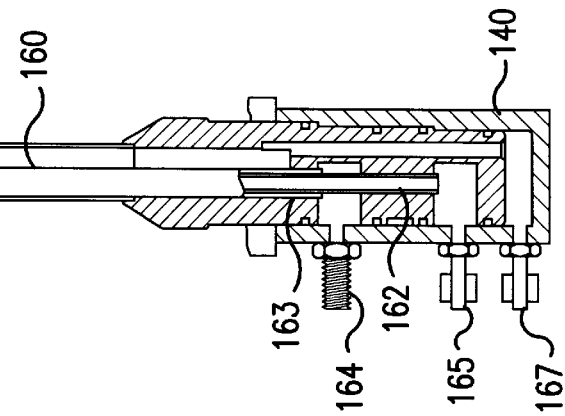
FIG. 9 is a schematic illustration of a squirt tube assembly used for water cooling the two coil assembly of FIG. 7.

FIG. 9 illustrates part of a support point 140 showed mounting the fixed end 139 of coil 136. The conductor 46 is, as mentioned previously, made from a hollow copper pipe. A squirt tube 160 extends the length of the conductor 46 from the support point 140 up to close to the closed end 161 of the conductor 46. The squirt tube is formed of a double walled tube having an inner pipe 162 within an outer pipe 163. The space between the inner and outer pipes 162 and 163 is sealed at both ends and is then evacuated by a vacuum source connected to a connector 164.

Cooling water introduced into the inner tube 162 at a connector 165 flows the length of the squirt tube 163 to emerge into the interior of the conductor 46 from a distal end 166 of the inner tube 162 close to the closed end 161 of the conductor. Cooling water then flows back down along the length of the conductor outside the squirt tube to flow to waste from the conductor via a connector 167.

By forming the squirt tube 160 as a double walled tube and evacuating the outer part 163 of the squirt tube, the inner supply tube 162 is substantially thermally insulated from the returning, heat-absorbing water flowing back down the conductor 46. As a result, the cooling water reaching the distal end 166 of the supply tube at the far end of the conductor 46 has not been substantially heated by the returning water.

This construction ensures good cooling of the conductor 46 over its full length, and especially at the distal end adjacent the electrode connected to the conductor 46. It will be appreciated that the electrode itself may become relatively hot and the cooling arrangement for the conductor 46 ensures that the end of the conductor which is connected to the electrode is not also heated to an excessive temperature.

Similar squirt tube arrangements are provided for the coil 135.

Referring again to FIG. 7B, a pick up loop 170 is provided mounted on a wall of the tank chamber 47 to enable the field within the tank chamber 47 to be monitored and used for feedback control of the rf drive circuitry (as will be explained later). This pick up coil is illustrated in more detail in FIGS. 10A and 10B. The coil comprises a single loop of conductor 171 on a mounting plate 172. The mounting plate is sealed in an aperture in the wall of the tank chamber 47 so that the loop of conductor 171 extends into the chamber.

One end of the loop 171 is connected to the chamber wall via a resistance 173 and the other end is connected to an rf feedthrough 174 so that the loop can be connected to an rf cable to supply a feedback signal to control equipment as will be described.

Again referring to FIG. 7B, a tuning capacitor 180 is also mounted on a wall of the tank chamber 47. FIGS. 11A and 11B illustrate this tuning capacitor in greater detail. The capacitor comprises a capacitance plate 181 mounted transversely at the end of a rotary shaft 182. The rotary shaft 182 is mounted for rotation in a mounting flange 183 by which the capacitor can be mounted extending through an aperture in the wall of the tank chamber 47. A stepper motor 184 is mounted to the exterior of the mounting flange 183 and is coupled to drive an exterior end 185 of the rotary shaft 182 via gears 186 and 187. The shaft 182 passes through a rotary vacuum seal to allow the shaft to be rotated by the stepper motor 184 without ambient air leaking into the tank chamber 47.

Rotation of the shaft 182 by the stepper motor 184 adjusts the proximity of the capacitor plate 181 to the coils 135 and 136 within the tank chamber 47, and thereby adjusts the resonant frequency of the resonant tank circuit. In practice, the tuning capacitor 180 is servo controlled by a control system which will be described later so as to maintain the resonant frequency of the tank circuit at the frequency of the rf signal energising the tank circuit via the coupling loop 150. It is important to keep the resonant frequency of the tank circuit precisely at the required frequency so as to maximize efficiency.

Figure 12:
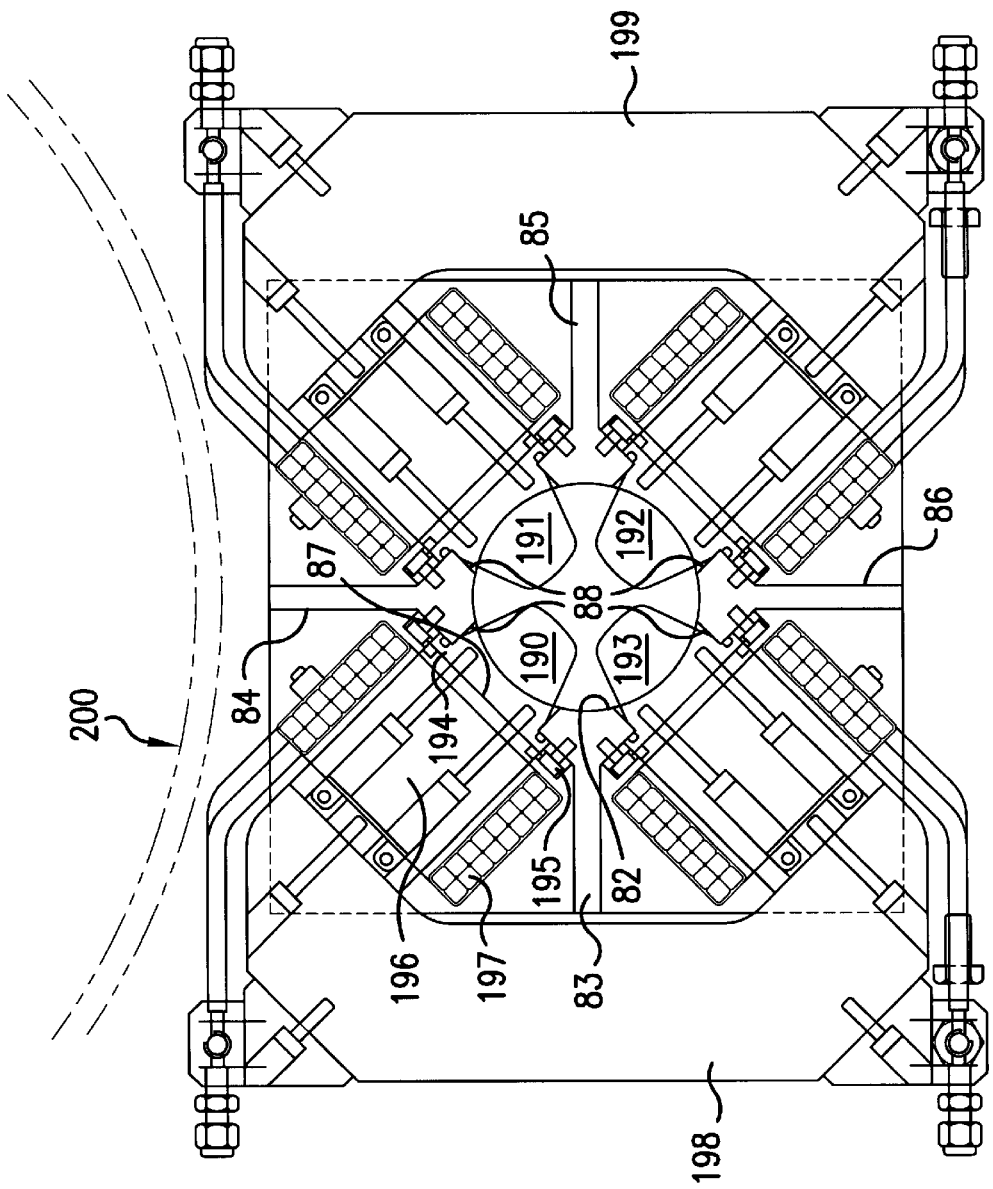
FIG. 12 is a cross-sectional view taken along the beam direction of a magnetic quadrupole used for focusing the ion beam in the accelerator assembly of FIG. 2.

One of the magnetic quadrupoles 50, 51, 52 and 53 from FIG. 2 is illustrated in greater detail in FIG. 12, which shows a sectional view of a quadrupole taken along the beam axis. Comparing FIG. 12 with the sectional view illustrated in FIG. 3G of part of the unitary mounting block 60, the webs 83, 84, 85 and 86 of the mounting block can be seen more clearly in FIG. 12. The magnetic quadrupole is formed of four magnetic poles 190, 191, 192 and 193 which are arranged penetrating into the open area of the unitary block 60 defined by the apertures 82 (FIGS. 3E and 3F). Each magnetic pole 190 to 192 is mounted in a respective one of the apertures 88 defined by the mounting surfaces 87 between the webs 83 to 86 of the unitary block 60.

As can be seen more clearly in FIG. 12, each magnetic pole has a flange 194 which is sealed against the respective support surface 87 and fastened in position by bolts 195. The magnetic poles 190 to 193 therefore effectively close the apertures 188 forming a vacuum seal between the flange 194 and the respective sealing surface 87. As a result, the magnetic poles 190 to 193 are effectively located within the vacuum chamber of the accelerator assembly so that the pole faces can be located as close as necessary to the axis of the beam, to maximize field strength, and also minimize stray magnetic fields.

A respective magnetic core 196 is fixed to the outer face of each magnetic pole 190 to 193 and each core 196 is surrounded by a respective winding 197. These windings can be water cooled tubular conductive elements.

Pairs of magnetic poles are then connected together by shunting yokes 198 and 199. In this embodiment, one shunting yoke 198 links the cores 196 for magnetic poles 190 and 193, and the other shunting yoke 199 links the cores of the magnetic poles 191 and 192. By providing shunting yokes 198 and 199, only on opposite lateral sides of the unitary block forming the accelerator assembly, as illustrated in FIG. 12, the shunting yokes do not interfere with the tank chamber of the neighbouring accelerating cavity, which is shown in outline at 200. This allows a more compact structure to be formed.

It is important to note that the magnetic quadrupole structure described above enables the magnetic poles themselves to be located effectively within the vacuum chamber of the accelerator assembly, while the field windings of each pole are still exterior of the vacuum chamber in atmosphere. This is highly desirable to maximize the efficiency of the produced magnetic field, to facilitate cooling of the windings and also for improved accessibility for maintenance purposes. The pole pieces themselves are used effectively as closures of apertures in the vacuum chamber formed by the unitary block 60.

Figure 13:
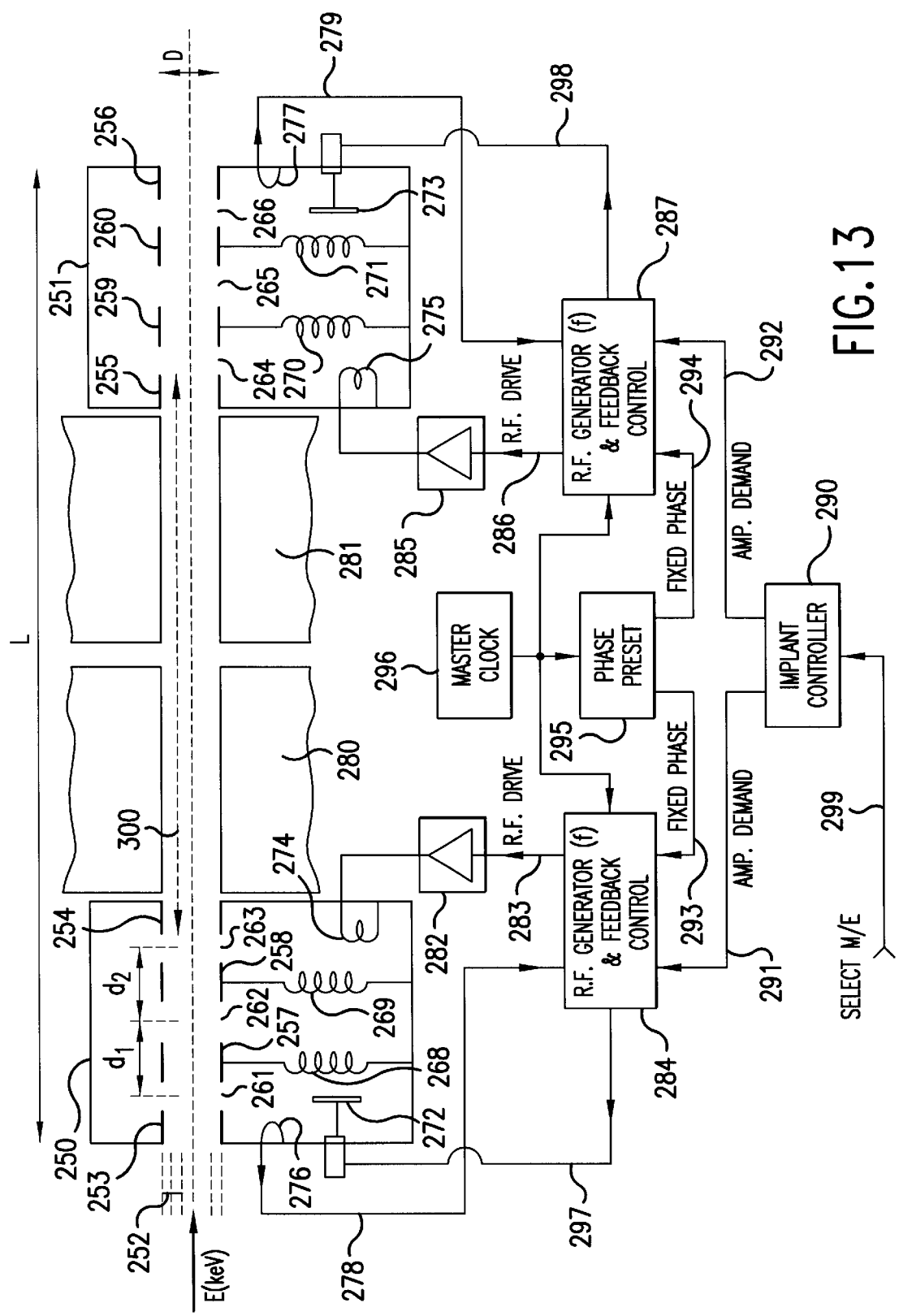
FIG. 13 is a schematic diagram of an rf accelerator assembly embodying and illustrating various features of the present invention.

Referring now to FIG. 13, this is a schematic diagram of an rf accelerator assembly. The illustrated assembly comprises first and second rf accelerator cavities or stages 250 and 251 respectively arranged in tandem for changing the energy of a beam 252 of ions for implantation. The beam 252 is injected into the first rf accelerator cavity 250 at energy E (keV).

Each cavity 250, 251 is a three gap cavity having grounded entrance and exit electrodes 253, 254 and 255, 256 respectively and a pair of intermediate rf electrodes 257, 258 and 259, 260 respectively. The electrodes of the first cavity 250 define a first gap 261, between entrance electrode 253 and first rf electrode 257, a second gap 262 between the two rf electrodes 257 and 258, and a third gap 263 between the second rf electrode 258 and the exit electrode 254. The cavity 251 has similar gaps 264, 265 and 266.

The rf electrodes 257 and 258 of the first cavity 250 are connected to coils 268 and 269, and the rf electrodes 259 and 260 of the second cavity 251 are connected to coils 270 and 271. Each cavity 250, 251 incorporating the respective electrodes and coils, provides a resonant tank designed to have a resonant frequency at or around a predetermined value f which is the intended operating frequency of the rf accelerator. The resonance of the cavities 250 and 251 can be fine tuned to match the desired operating frequency f by means of adjustable tuning capacitors 272 and 273. Rf energy is coupled to the respective cavities 250, 251 via coupling loops 274 and 275. Pick up loops 276 and 277 in the respective cavities provide an output on lines 278 and 279 providing a feedback signal representing the amplitude and phase of the rf voltage in the respective cavity.

A pair of magnetic quadrupole lenses 280 and 281 are located in sequence between the cavities 250 and 251.

An rf amplifier 282 amplifies an rf drive signal on a line 283 from an rf generator 284 and supplies the amplified rf signal to energise the coupling loop 274 in the first rf cavity 250. Similarly a second rf amplifier 285 amplifies an rf drive signal on a line 286 from a second rf generator 287, to supply an amplified rf signal to the coupling loop 275 of the second rf cavity 251.

Each of the rf generators 284 and 287 include feedback control. The feedback control is effective to compare the feedback signal on the respective line 278 or 279 with amplitude demand signal and the fixed reference phase value to which the phase is locked. The amplitude demand and fixed phase value signals for the rf generator and feedback control 284 are provided on lines 291 and 293 respectively and the amplitude demand and fixed value phase signals for the generator and feedback control 287 are provided on lines 292 and 294 respectively.

It is an important feature of all rf linear accelerators that the phase of the rf fields in each of the cavities not drift.

Phase drift can result in bunches of charged particles passing through the accelerator not receiving the prescribed and preset acceleration.

It is a feature of embodiments of the present invention that the feedback control in the rf generators 284 and 287 ensures that the phase of the field actually measured in the respective cavity is closely maintained at the respective fixed reference phase value.

To this end, the fixed phase value signals on lines 293 and 294 are derived from a fixed phase preset unit 295, which produces fixed signals which cannot be adjusted either automatically or by operator intervention. In preferred embodiments the difference between the fixed phase value signals of the respective stages is either zero or 180°.

Each of the rf generators 284 and 287 is typically a frequency synthesiser and the generators 284, 287 as well as the fixed phase preset unit 295 are all synchronised by clock pulses from a master clock 296.

It should be appreciated that the resonant tank circuits 250 and 251 are provided to ensure that the required rf potential is applied to the rf electrodes in the respective cavity with minimum ohmic losses. Accordingly, it is very important that the resonance of the tank circuits is accurately at the fixed frequency f of the rf drive. Deviation of the tank circuit resonance from the drive frequency f requires the amplitude of the rf drive to be increased for the same rf voltage applied to the electrodes of the cavity. Also, if the resonance of the cavity drifts away from the frequency f, in the absence of feedback control, there would be a change in the phase of the rf voltage on the electrodes. For small deviations in the resonance of the cavity, the feedback control in the respective rf generator can provide compensation by changing the amplitude and phase of the rf drive on line 283 to maintain the amplitude represented by the feedback signal on line 278 at the demand value on line 291 and the phase of the feedback signal constant as required by the fixed value signal on line 293. The generator and feedback control 287 operates similarly to maintain correct amplitude and fixed phase in the cavity 251.

However it is nevertheless desirable to ensure that the resonance of the cavities remains at the drive frequency f. For this purpose, the feedback control of the generators 284 and 287 also adjusts the variable capacitance 272 and 273 of the respective cavities by applying control signals on lines 297 and 298 respectively. In practice, feedback control of generator 284 may adjust the variable capacitor 272 of the cavity 250 to minimize the amplified error signal between the feedback phase on line 278 and the fixed phase signal on line 293.

Because the variable capacitor 272 is a mechanical device, as is described above and illustrated in FIGS. 11A and 11B, the response time of the variable capacitor 272 is relatively slow. Thus, the electronic feedback control of the rf drive signal is required to maintain accurate amplitude and fixed phase within the cavity in response to any fast changes in the feedback signal, such as can arise due to mechanical vibration of the cavity. On the other hand, the capacitance 272 is adjusted to compensate for slow changes in the resonance of the cavity, e.g. resulting from thermal expansion.

The implant process as a whole is controlled by a micro processor based implant controller 290. The implant controller may control a number of operating parameters of the implanter but for the purposes of illustrating the present invention, the controller 290 is shown producing only the amplitude demand signals on lines 291 and 291 for the rf generator and feedback control units 284 and 287. The implant controller 290 may change the value of the demanded amplitude in response to various operator input controls, including specifically an operator requirement to set up the implanter for implanting ions of a different mass/charge ratio (m/e). This control is illustrated in FIG. 13 by the input line 299.

In FIG. 13, there is a flight path distance indicated by the arrow 300 between the exit electrode 254 of the first cavity 250 and the entrance electrode 255 of the second cavity 251. As has been explained previously, it is a known requirement in the construction of multiple cavity linear accelerators to ensure that bunches of ions accelerated by a first cavity arrive at the first gap of the second cavity, when the rf voltage across this first gap is at an appropriate value to provide the required acceleration to the bunch of ions. As also explained above, a different set up of any linear accelerator is required for use with ions of different mass-to-charge ratio, because the speed of the ions emerging, even with the same energy, from the first cavity will be different depending on the mass-to-charge ratio. As a result the flight time along the distance 300 will depend on the mass-to-charge ratio of the ions.

In an embodiment of the present invention, this flight time variation resulting from differences in mass-to-charge ratio for different ions is compensated for by keeping constant both the distance between the two cavities 250 and 251 and the phases of the rf voltages in the two cavities 250 and 251 and setting up the accelerator for the desired ion mass-to-charge ratio by altering the speed of the ions from the first cavity to the second. In the illustrated example, this is achieved by changing the amplitude demand signal on line 291 so that the rf field amplitude in the first cavity 250 is adjusted accordingly. For example, for an ion with lower mass-to-charge ratio, a slight reduction in rf field amplitude in cavity 250 can slightly reduce the speed of the bunches of ions leaving the cavity, thereby increasing the flight time over distance 300, with the result that these bunches of ions arrive at the proper region in the rf voltage wave form in the gaps of cavity 251. Because of the substantial length of the distance 300, only a small variation in the speed (or energy) of ions from the first cavity can be sufficient to ensure a proper time of flight of these ions to the second cavity.

In fact, we have found it desirable to ensure that the distance 300 is greater than the overall length between the entrance and exit electrodes, of the first cavity 250. In the preferred embodiment, the length 300 is about three times the length of the first cavity. With such an arrangement, we have found that a good adjustment range of time of flight can be provided, suitable for ion species including singly and doubly charged boron and singly, doubly and triply charged phosphorous, by adjusting the amplitude of the rf voltage at the first booster by no more than about 15% of the maximum applied voltage. This implies that the process for setting up the two cavities for ions of different mass/charge ratio may involve sacrificing only up to about 15% of the energy increment delivered by the first cavity.

Importantly, it should be noted that the rf supplies to the two booster cavities of the illustrated accelerator arrangement can be fully controlled using only two control inputs, to set up the required rf amplitudes of the two cavities, for tuning the accelerator assembly for ions of different mass/charge ratio, as well as for providing a desired final ion energy. This can significantly simplify the setting up of the booster to deliver ions of different m/e values at required output energies.

Referring again to FIG. 13 the overall length of the rf accelerator assembly from the entrance electrode of the first cavity to the exit electrode of the second cavity is L. In at least one plane containing the axis of the ion beam through the accelerator assembly, the electrodes forming the cavities of the assembly have apertures with a largest transverse dimension which is not less than a distance D. It will be understood that this largest transverse dimension would be the major dimension of the slit-shaped electrode apertures, as have been described above with respect to FIGS. 4, 5 and 6.

By ensuring that L/D is less than about 25, an excellent combination of performance parameters is obtained. In spite of the need, described above, to maintain a substantial drift distance 300 between the two accelerator cavities, the overall length L of the accelerator is still rather low, which reduces the footprint of the tool when installed in a fab. On the other hand, the transverse dimension D of the apertures through the accelerator, in at least one axial plane, is relatively large, which improves the acceptance of the accelerator allowing larger beam currents, especially during drift mode when the accelerator assembly is inactive, for implants at energies F and below. Our preferred design has a value of L/D of about 18.

In summary, the implanter may comprise an ion beam generator for generating a beam of ions to be implanted, in which said ions are at a first energy, and a radio frequency linear accelerator assembly arranged when energised for accelerating ions of said beam to a second energy, said assembly comprising electrodes defining a series of gaps for changing the energy of ions of said beam, said electrodes having apertures through which the ions pass, wherein all the electrodes of said assembly are contained in a length L and the apertures of the electrodes have respective largest dimensions transverse to the beam which are not less than D, where L/D is less than 25. This is particularly useful, when the accelerator assembly comprises first and second rf booster stages in tandem along the beam direction, each of said booster stages comprising entrance and exit electrodes and at least one intermediate rf electrode defining a series of gaps for changing the energy of the ions of said beam, and an adjacent pair of magnetic quadrupoles located between said first and second booster stages.

Figure 14:
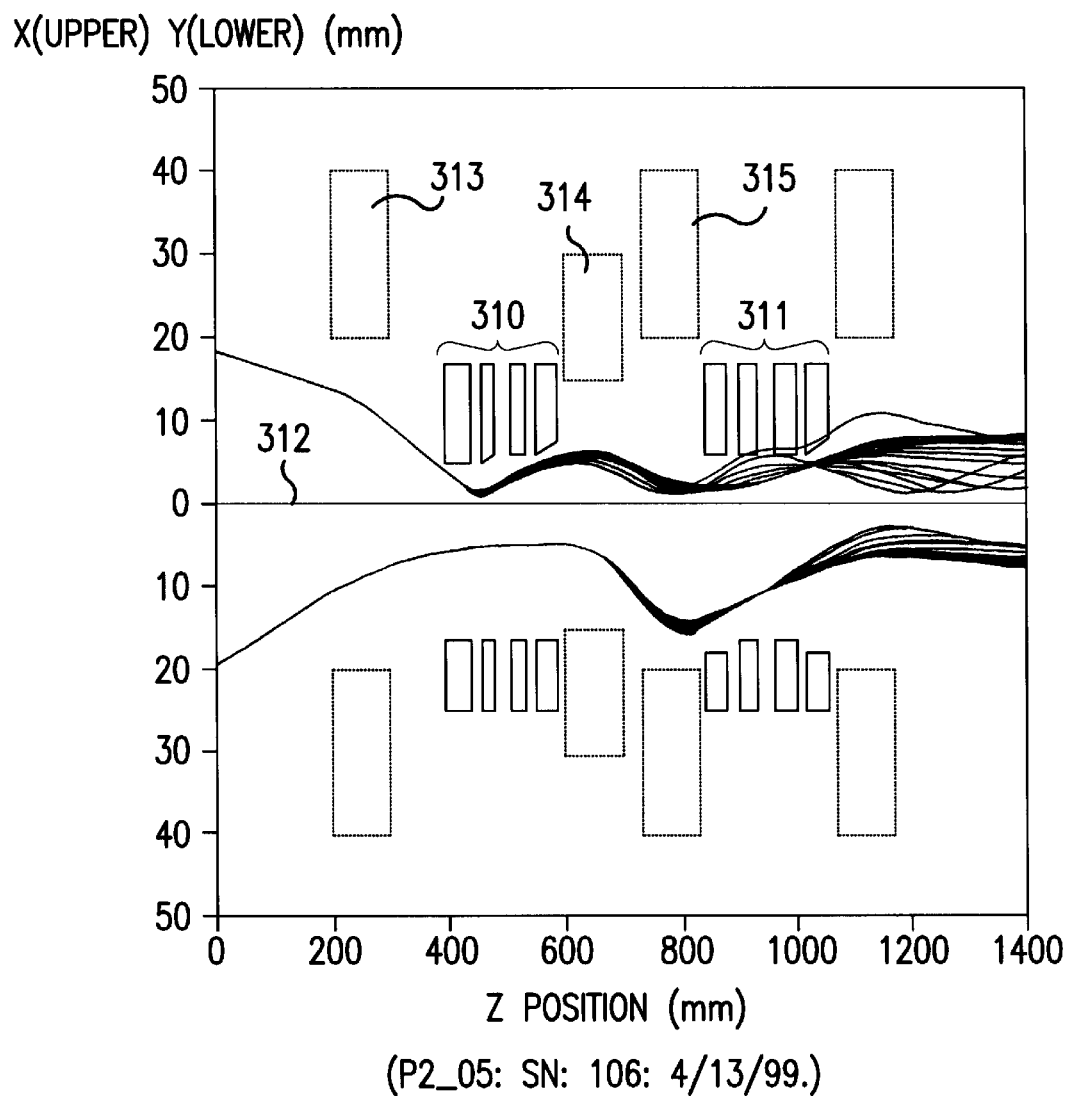
FIG. 14 is a graphical representation of the profiles at different times of an ion beam passing through the rf accelerator assembly illustrated in FIG. 2, when the accelerator is energised.
Figure 15:
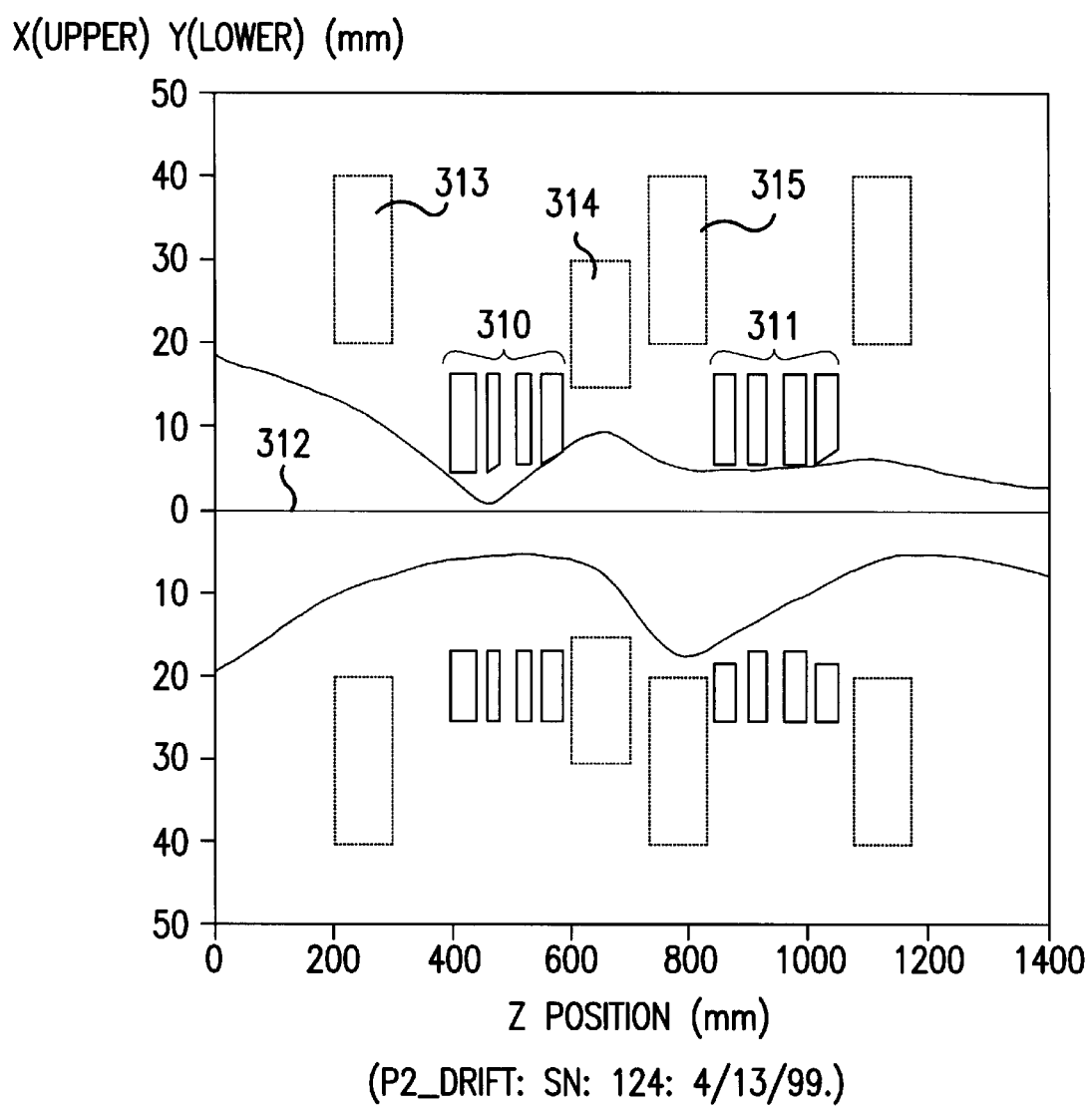
FIG. 15 is a graphical representation of the ion beam profile as in FIG. 14, but with the accelerator in drift mode.

The performance of the slit shaped electrodes used in the accelerator assembly can be visualised from FIGS. 14 and 15 which show the profile of an ion beam passing through the elements of the accelerator. The upper part of each of FIGS. 14 and 15 shows the beam profile in an X direction transverse to the beam axis, and the lower part of the Figure shows the beam profile in the orthogonal Y direction transverse to the beam axis. The Y direction is the direction of the long dimension of the slit apertures of the electrodes. Accordingly, in FIGS. 14 and 15, electrodes 310 of the first accelerator cavity and electrodes 311 of the second accelerator cavity are shown spaced relatively close to the axis 312 of the beam in the X direction (top part of the drawings) and relatively further away from the axis in the Y direction (bottom part of the drawings). In each drawing, the beam direction is from left to right.

In the simulation used to generate FIGS. 14 and 15, the beam injected into the accelerator has similar dimensions in both X and Y directions. A first magnetic quadrupole focuses the beam in the X direction, and tends to defocus the beam in the Y direction. Subsequently, the beam is confined in the X direction to approximately 6 mm from the beam axis, whereas the beam extends in the Y direction to over 15 mm from the axis 312.

The effect of the two magnetic quadrupoles 314 and 315 between the two cavities of the accelerator is illustrated. The first quadrupole 314 brings the beam back towards a focus in the X direction, and the second quadrupole 315 refocuses the beam in the Y direction.

The simulation represented in FIG. 14 assumes an injected beam of doubly charged phosphorous at 200 kev and a final beam energy after acceleration of about 850 keV. The beam emitted by the accelerator assembly is assumed to contain ions arriving at the first accelerating cavity over ±50° of phase of the rf excitation voltage applied to the first cavity. The effect of the accelerator assembly on ions of different injection phases is represented by the different profile lines in the drawing.

FIG. 15 represents the profile of the beam passing through the accelerator assembly in drift mode, that is when the electrodes of the accelerator assembly are not energised, so that no acceleration of the beam takes place. The injected beam is again $P^{++}$ at 200 keV. Once again it can be seen that the beam profile extends further in the Y direction than the X direction. By providing slit shaped electrodes a higher proportion of the beam can be accommodated through the accelerator assembly in both accelerating and drift modes without excessive field penetration into the electrode cavities when in the accelerating mode.

Importantly, the X direction in FIGS. 14 and 15, that is the narrow dimension of the slit apertures of the electrodes, should be aligned with the dispersion plane of the analyser magnet 12 which is located upstream of the rf accelerator assembly, as illustrated in FIG. 1. The magnet 12 functions to bring ions of the desired m/e to a substantial focus in the X direction. Normally a mass selection slit is located at this focus to allow only the required ions to continue in the beam for implantation. In the present example, the focal point of the mass analyser magnet is within the first three gap booster stage of the rf accelerator.

The magnet 12 is also effective to bring the beam to a waist in the Y direction in the vicinity of the first magnetic quadrupole 313 (FIGS. 14 and 15) in front of the entrance electrode of the first booster stage. This magnetic quadrupole 313 is then energised so as to shift the effective waist in the beam in the Y direction to the location along the beam of the second magnetic quadrupole 314, immediately after the first booster stage. To cause this effect, the first quadrupole 313 is energised to provide focusing in the X direction and defocusing in the Y direction. It should be understood that the ion beam entering the analysing magnet 12 from the ion source 11 is usually ribbon shaped having a narrow transverse dimension in the dispersion plane of the magnet. Thus the beam of ions of required m/e leaving the magnet 12 can be brought to a relatively tight focus in the X direction, but to a wider waist in the Y direction, of dimensions dependant on the ion species and the set up or "tuning" of the ion source.

Referring again to FIG. 14, the Y-defocusing, X-focusing effect of the first magnetic quadrupole 313 produces a relatively small shift (to the left in FIG. 14) in the position of the X-focus of the beam, which is close to the first and second electrodes of the first booster stage. In this way the beam is compressed in the X direction to pass through the narrow dimensions of the slit apertures of the electrodes. As the beam ions pass through the first booster stage, ions near the edge of the beam, in the X direction, experience focusing effects due to curvature of the electric field near the aperture edges of the electrodes. Ions passing through the booster at different times relative to the phase of the rf field are focused/defocused by differing amounts, which is represented in FIG. 14 by the separating of the beam profile in the X direction into several lines. This modest effect in the first booster stage becomes more dramatic in the second booster stage and adds to the difficulty in controlling the beam through the accelerator and subsequently.

On the other hand, in the Y direction the beam passes through the first booster stage well away from the edges of the electrode apertures, where the electric field in the Y direction is relatively planar, so that there is minimal electric field focusing. The resulting improvement in beam control in the Y direction can be seen.

As mentioned, the first magnetic quadrupole moves the Y-waist in the beam to the location of the second quadrupole 314. This second quadrupole is required to bring the beam back to a focus in the X direction at the following third quadrupole 315. Because the beam has a Y waist at the second quadrupole 314, the Y-defocusing effect is reduced, and the beam can then be brought back towards a Y-waist by the third quadrupole 315 without excessive X defocusing. A fourth magnetic quadrupole may then be provided after the exit electrode of the second booster stage to provide some X-refocusing, which is generally required to match the ion optical characteristics of the energy filter 25.

As can be understood from the above, the aperture of the electrodes of the first booster stage function as the mass selection slit of the implanter (assuming there is no velocity variation in the ions passing through the analyser magnet), since ions of other m/e in the beam will not enter and pass through the booster without hitting an electrode. A baffle plate may be located just in front of the entrance electrode of the first booster stage to absorb the greater part of the non-selected ions from the beam, so as to avoid damaging or overheating the entrance electrode.

Also, because the accelerator electrodes have relatively large dimensions in the Y direction, only a single magnetic quadrupole is required upstream of the first booster stage of the accelerator.

In the preferred embodiment, the rf accelerator assembly as illustrated in FIGS. 2 to 12 has the following dimensions:

| | |
|---|---|
| overall length (L) of accelerator assembly from entrance electrode of first cavity to exit electrode of second cavity: | 587 mm |
| transverse dimensions of aperture of entrance electrode of first cavity: | 46 × 10 mm |
| transverse dimensions of aperture of first rf electrode of first cavity: | 34 × 10 mm |
| transverse dimensions of aperture of second rf electrode of first cavity: | 34 × 12 mm |
| transverse dimensions of aperture of exit electrode of first cavity and both entrance and exit electrodes of second cavity: | 46 × 12 mm |
| transverse dimensions of aperture of first and second rf electrodes of second cavity: | 34 × 12 mm |
| smallest slit length of all electrode apertures in the assembly (D): | 34 mm |
| gap between entrance electrode and first rf electrode of first cavity: | 14 mm |
| length along beam axis of first rf electrode of the first cavity: | 16 mm |
| gap between first and second electrodes of first cavity: | 32 mm |
| length along beam axis of second rf electrode of first cavity: | 26 mm |
| gap between second rf electrode and exit electrode of first cavity: | 16 mm |
| drift distance between exit electrode of first cavity and entrance electrode of second cavity: | 349 mm |
| gap between entrance electrode and first rf electrode of second cavity: | 16 mm |
| length along beam axis of first rf electrode of second cavity: | 30 mm |
| gap between first and second rf electrodes of second cavity: | 32 mm |
| length along beam axis of second rf electrode of second cavity: | 40 mm |
| gap between second rf electrode and exit electrode of second cavity: | 16 mm |

The predetermined frequency of the rf excitation voltage for the accelerating cavities is set at a figure close to 20 MHZ. The maximum amplitude of rf voltage which can be applied to each of the rf electrodes in the assembly is about 75 kV. The maximum injection energy E is about 100 kV per charge state of injected ions.

The accelerator assembly is intended to handle and accelerate primarily the ions $B^{++}$ (m/e=5.5), $B^+$ (m/e=11), $P^{++}$ (m/e=15.5), and $P^{+++}$ (m/e=10.3). The structure parameters of the accelerator assembly are designed to be near optimum for the $B^+$ ions. However, for ion implantation applications, useful energy gains from at least the first booster stage can be obtained for ions with an m/e range up to about 40.

If the maximum electrostatic pre-acceleration voltage available in the ion implanter, i.e. the voltage difference between the ion source and the entrance electrode of the first cavity of the rf accelerator assembly, is about 100 kV, the maximum injection energy for $P^{++}$ ions would be 200 keV. However, in order to obtain optimum performance, at least from the first cavity or stage of the rf accelerator, it is important that the ions of different mass/charge ratio are injected into the assembly at about the same speed. Since for the same speed the energy of a particle is proportional to its mass, this implies that the injection energy for $B^+$ should be about 11/15.5 of half the injection energy for $P^{++}$. Since the maximum injection energy for $P^{++}$ is set by the maximum available electrostatic pre-acceleration voltage, this implies that the pre-acceleration voltage should be reduced by about 11/15.5 when running $B^+$ compared to running $P^{++}$.

Figure 16A:
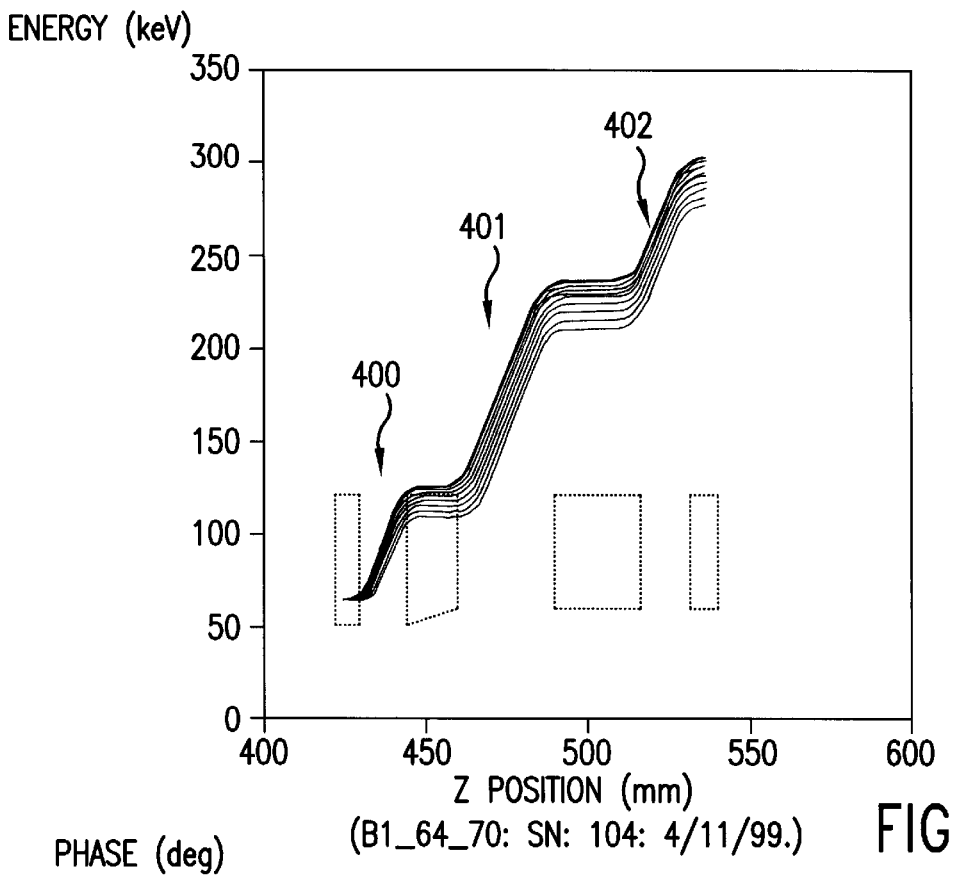
FIG. 16A is a graphical representation of the energy of $B^+$ ions against their position along the length of a three gap rf accelerator stage, for ions entering the first gap of the stage over a range of different times in the wave form of the applied rf field, when the applied field has maximum amplitude.
Figure 16B:
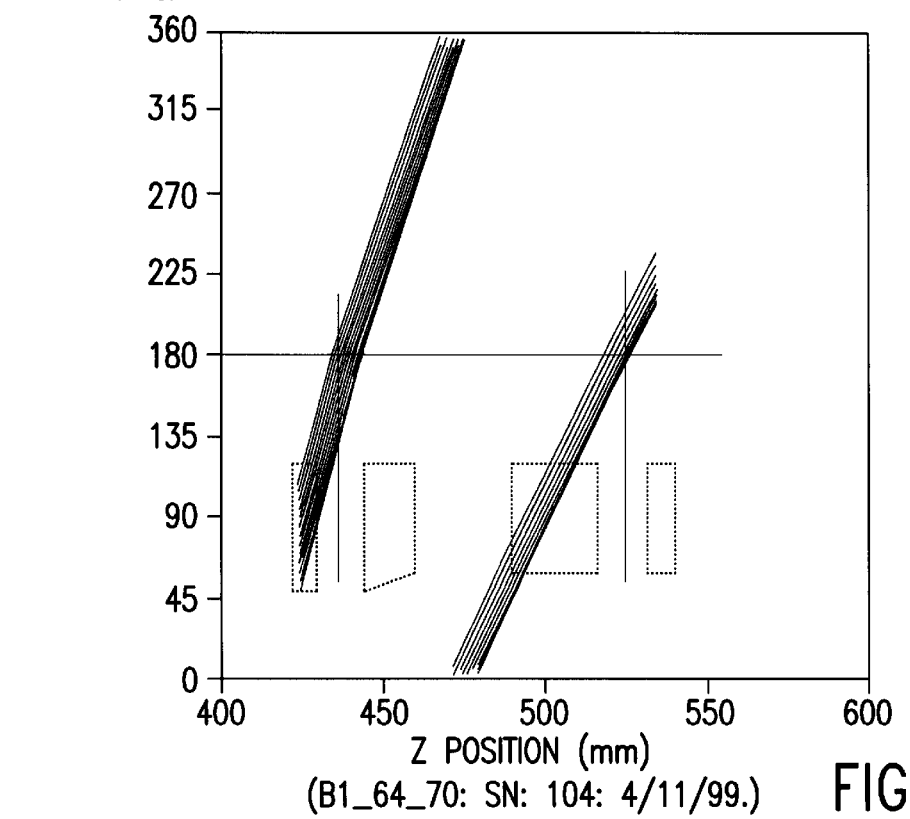
FIG. 16B is a graphical representation of the rf field wave form phases versus the position along the length of the three gap rf accelerator stage of the $B^+$ ions being accelerated by the stage, again when the applied field has maximum amplitude.

FIGS. 16A and 16B are graphical representations illustrating the way in which the energy and also phase of the applied rf voltage change for $B^+$ particles passing through the first accelerator stage. In each of FIGS. 16A and 16B, the x-axis represents the distance travelled by a $B^+$ ion in the z direction, i.e. along the beam direction, through the electrodes of the first accelerator stage. The position of the electrodes is represented schematically in the drawings by the dotted lines.

The y-axis of FIG. 16A represents the energy of the ion as it passes through the accelerator. The y-axis of FIG. 16B represents the phase of rf voltage experienced by the ion as the ion travels in the z direction. The various lines in each of FIGS. 16A and 16B represent the energy changes of ions entering the first gap of the accelerator stage at different times during application of the rf signal.

Generally, the drawings use the convention that 180° phase represents the time of a peak in the forward acceleration rf voltage across the first gap between the entrance electrode and the first rf electrode. Maximum acceleration in the second gap between the two rf electrodes then occurs at 360/0° phase and maximum acceleration in the third gap occurs again at 180° phase. In FIGS. 16A to 16B, the ions are travelling from left to right.

Considering firstly FIG. 16B, this shows ions entering the first gap of the accelerator stage at points in the rf waveform with phase angles ranging from about 90° to about 150°. The first ions represented in FIG. 16B to enter the gap at 90° phase angle cross the centre of the gap at about 135° phase angle, represented by the lowermost line in FIG. 16B. The latest ions to enter the gap at about 160° phase angle, cross the centre of the gap at a phase angle of just over 180°. As mentioned previously, the maximum acceleration in the first gap of the accelerator stage occurs at the phase angle of 180°. Thus, ions crossing the centre of the gap at around 180° phase angle should experience the greatest increase in energy on crossing the gap. Ions crossing the centre of the gap at smaller phase angles should experience lesser increases in energy. This variation in energy increase can be seen in FIG. 16A. The latest ions entering the first gap and crossing the centre of the gap at around 180° of phase receive the greatest energy increment, represented by the upper lines in FIG. 16A. Ions arriving at the gap earlier in phase receive less energy as represented by the lower lines in FIG. 16A. The energy increment across the first gap is represented at 400 in FIG. 16A.

The ions represented in the drawings which have traversed the first gap, then cross the centre point of the second gap between phase angles 345° to about 30°. It will be appreciated that 360/0° provide the maximum acceleration for ions crossing the centre gap. The energy increment to ions crossing the centre gap is indicated in FIG. 16A at 401.

The ions then traverse the third gap crossing the centre of the third gap at phase angles between about 170° and 200°. The phase of maximum acceleration in the third gap is 180°. The energy increment provided by the third gap is shown in FIG. 16A at 402.

It will be noted that the ions indicated in FIG. 16B cross the centre line of the first gap, mostly over a range of phase angles below 180°. This corresponds to crossing the gap when the field is rising from maximum deceleration to maximum acceleration at the gap. As a result, early ions, entering the gap at a lower phase angle, are accelerated less across the gap than later ions arriving at a higher phase angle. This produces some energy dispersion of the ions proceeding from the first gap, as can be seen in FIG. 16A. The ions cross the centre gap at phases rather equally distributed on either side of 360/0°. This will produce only a small amount of additional energy dispersion. The ions then cross the centre line of the third gap mostly at phases somewhat greater than 180°, that is when the field is falling from maximum acceleration to maximum deceleration. Although the energy dispersion introduced at the first and middle gaps has slightly reduced the phase spread of the ions represented by the lines in FIG. 16B becoming closer together, the ions entering the first gap first (at lowest phase angle) are still first when crossing the third gap. As a result, the early ions which are given least energy increment at the first gap, are given the most energy increment at the third gap, and the late ions given the greatest energy increment at the first gap are given the least energy increment at the third gap. Thus, organising and setting up the accelerator assembly in this way causes the third gap to at least partially cancel out the energy dispersion introduced by the first gap. In the absence of any reduction in phase spread, the energy dispersion effect of the first and third gaps could largely cancel each other out so that the overall energy dispersion would be that induced by the centre gap.

In ion implanters, the percentage energy dispersion of the final beam is important. Thus, finally implanted ions should have energies which fall within a certain percentage of the target energy, say ±5%. In the example of FIGS. 16A and 16B, the final energy of ions leaving the accelerator stage is about 300 keV±15 keV. This was achieved from ions injected into the accelerator stage having a range of phases of about 60°. It can be seen, therefore, that adequate energy dispersion performance is obtained over an input phase range which will capture nearly 17% of the ions in an unbunched injected beam. This level of performance can be obtained with a three gap rf cavity designed so that ions cross the first gap when the field is rising (as defined above), and cross the third gap when the field is falling.

It may be noted, that the energy dispersion introduced by a single gap in which ions cross the centre of the gap at phase angles from −30° to +30° of the angle of maximum acceleration is theoretically ±6.7%. It can be seen, therefore, that the performance of the accelerator stage set up as illustrated in FIGS. 16A and 16B is substantially superior from the point of view of providing limited energy dispersion for ions accepted over a wide phase angle. Importantly also, this set up of the accelerator stage ensures that the bunch of ions leaving the stage, with minimal energy spread, can be delivered, without becoming debunched, to a subsequent accelerator stage for further acceleration. This superiority is maintained when a conventional buncher is employed preceding the accelerator, to include more of the ions of the beam in the input phase range.

In the example of FIGS. 16A and 16B, the accelerator is operated with the applied rf voltage near a maximum at 70 kV and the injection energy for B$^+$ ions at 64 keV, and with the dimensions of the accelerator stage as set out above for the first cavity. The frequency of the applied rf voltage is about 20 MHZ. Increasing the injection energy would permit a higher frequency of the rf voltage whilst still maintaining the phasing of the ions crossing the gaps of the accelerator stage as described above. Similarly, increasing the distance between the gaps of the accelerator stage would require increased injection energies for the same frequency of rf voltage.

Figure 17A:
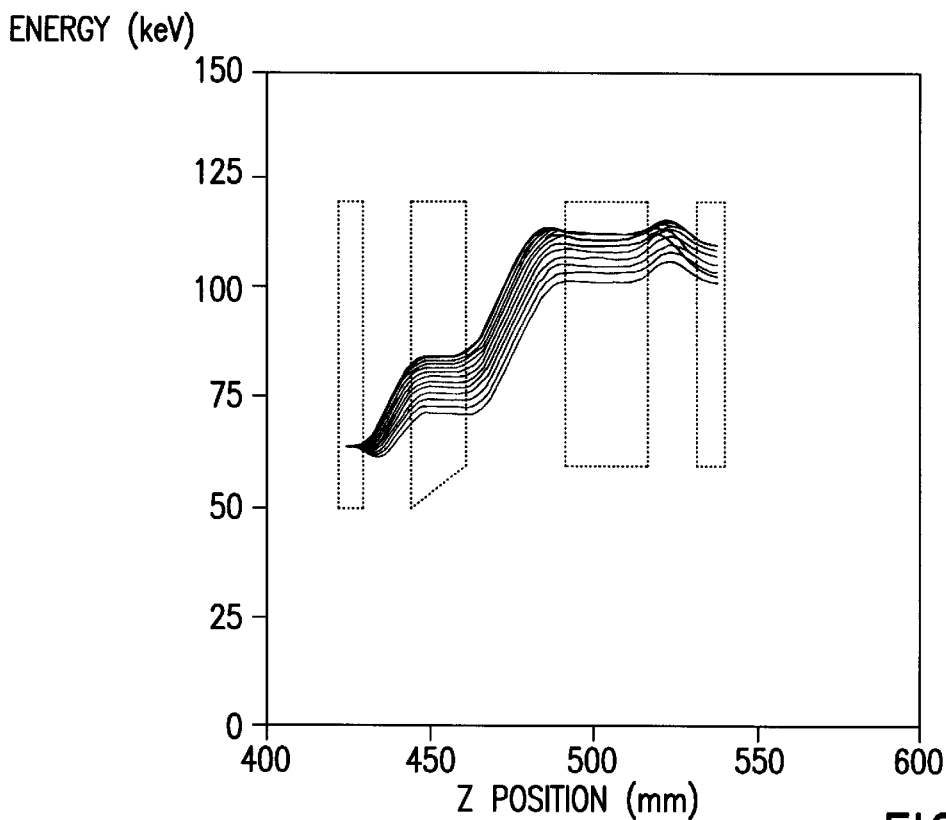
FIGS. 17A and 17B are graphical representations corresponding to FIGS. 16A and 16B, but when the amplitude of the applied rf voltage is at a low value, providing less energy boost to the ions.
Figure 17B:
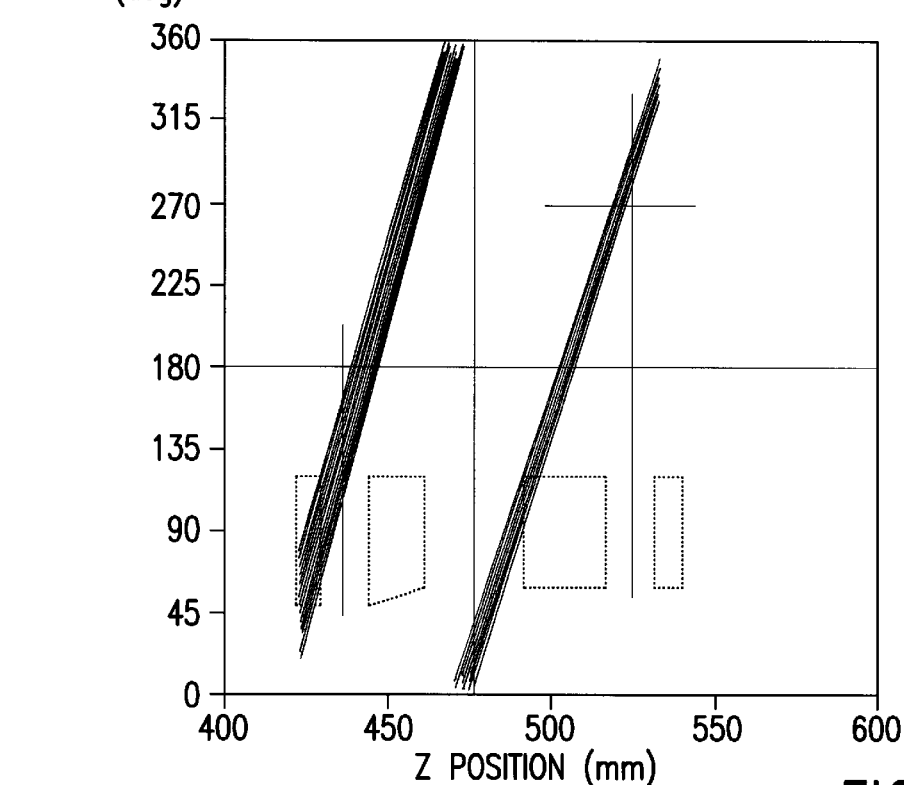
Figure 18A:
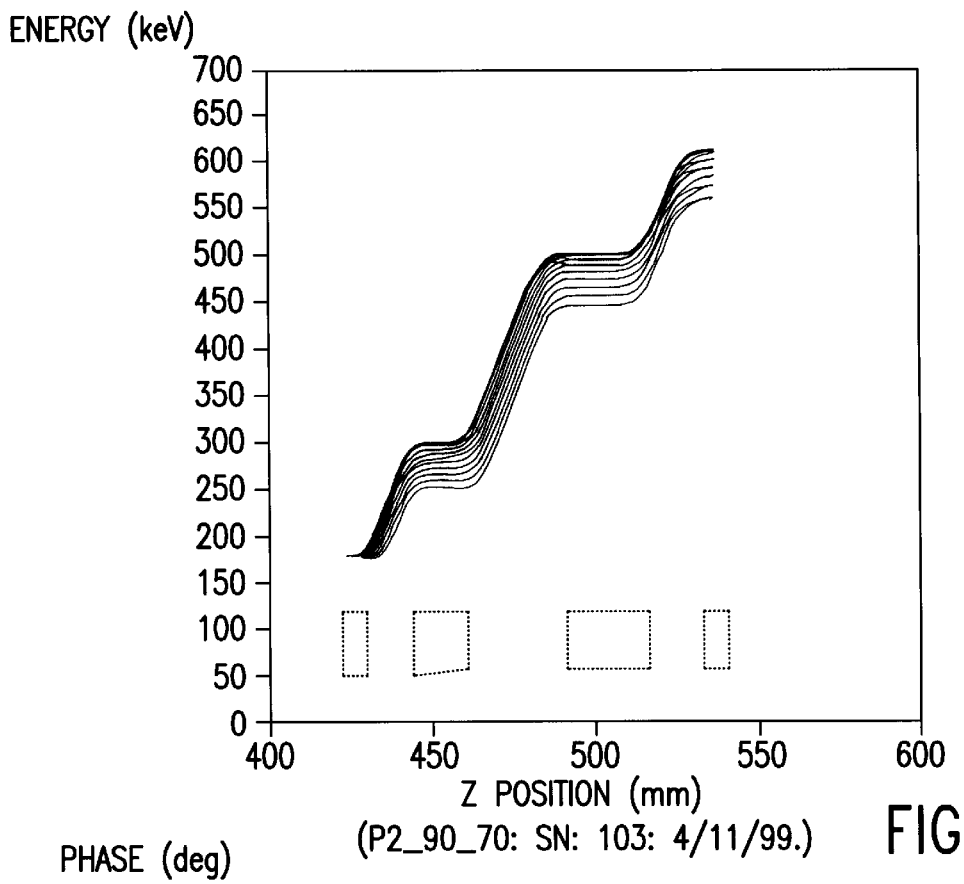
FIGS. 18A and 18B, 19A and 19B, and 20A and 20B are graphical representations corresponding to FIGS. 15A and 15B, but for $P^{++}$ ions at three different respective applied rf voltage amplitudes.
Figure 18B:
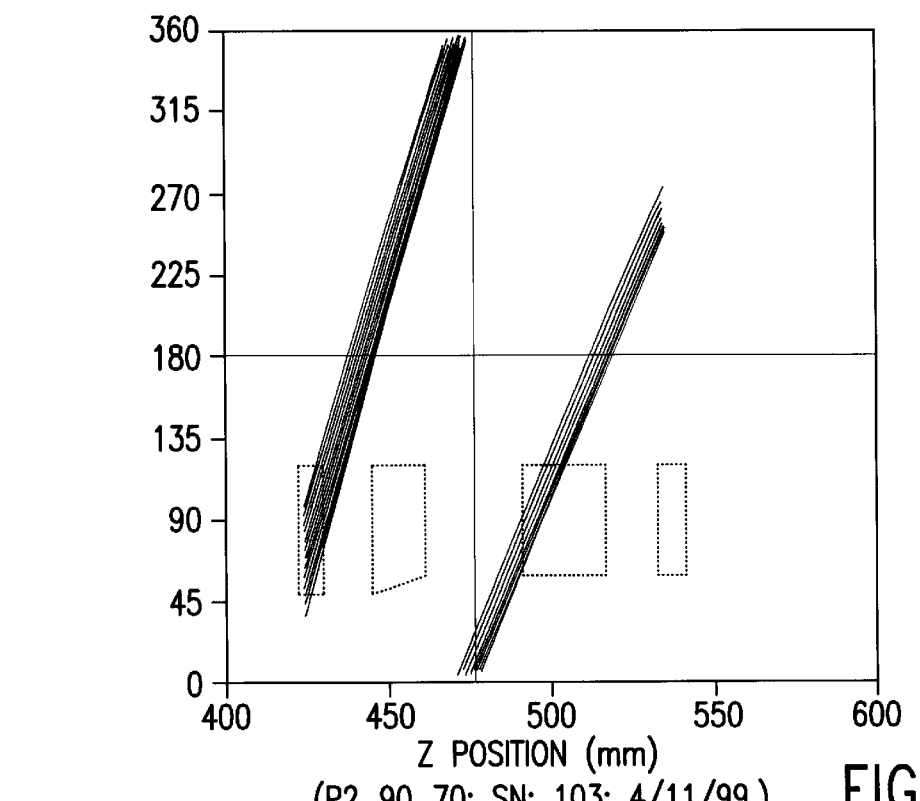

FIGS. 17A and 17B illustrate the energy increments and phasing of ions through the first accelerator stage, when the rf voltage is set at a much lower value, 25 kV. The injection energy of B$^+$ ions is still 64 kV. Ions having a phase spread of 60° enter the first gap of the accelerator stage and cross the centre of the first gap at phase angles below 180°. The ions cross the centre gap at phase angles around 360/0° and cross the third gap at phase angles above 180°. As a result, energy spread introduced by the first gap is reduced by the second gap. However, because of the reduced rf voltage, the phase spread of the ions is reduced as they pass through the accelerator stage. Nevertheless, the ions cross the centre of the third gap at around 270° of phase which provides for maximum energy dispersion in the opposite direction to the dispersion introduced by the first gap. Also, the ions cross the centre of the central gap slightly before the maximum acceleration phase 360/0°, which also tends to cancel the energy dispersion of the first gap. The resulting energy dispersion of the beam from the accelerator stage is, as shown in FIG. 17A, about ±5 keV for an output energy in excess of 100 keV, which is still less than ±5%.

Figure 19A:
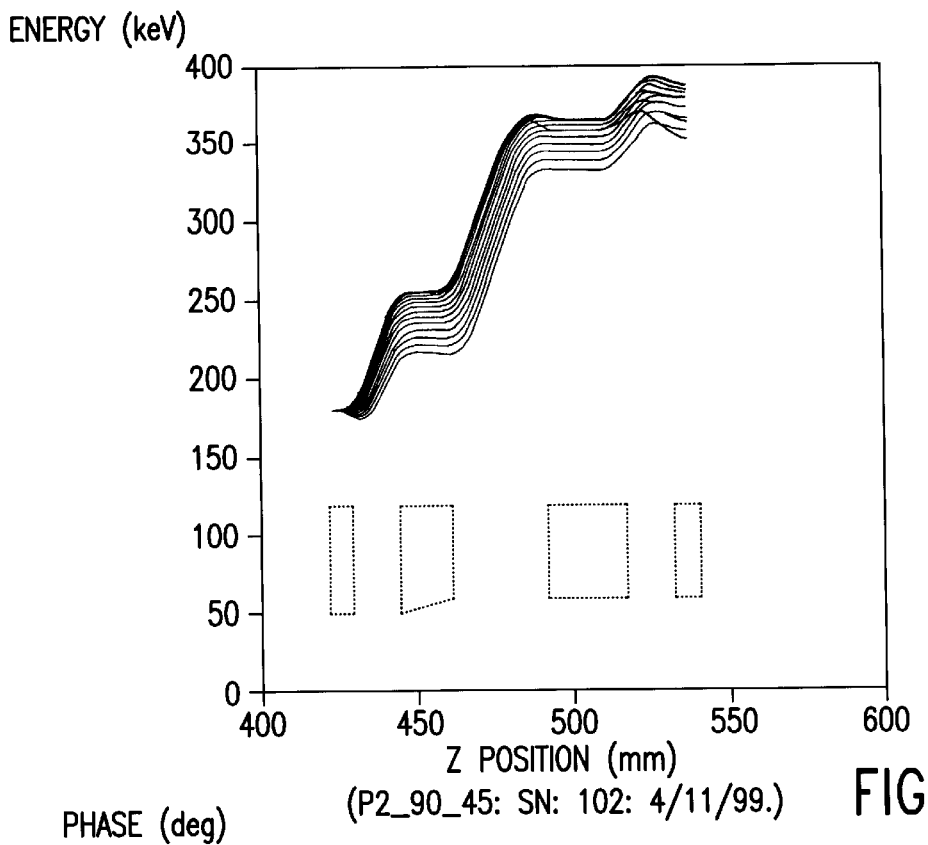
Figure 19B:
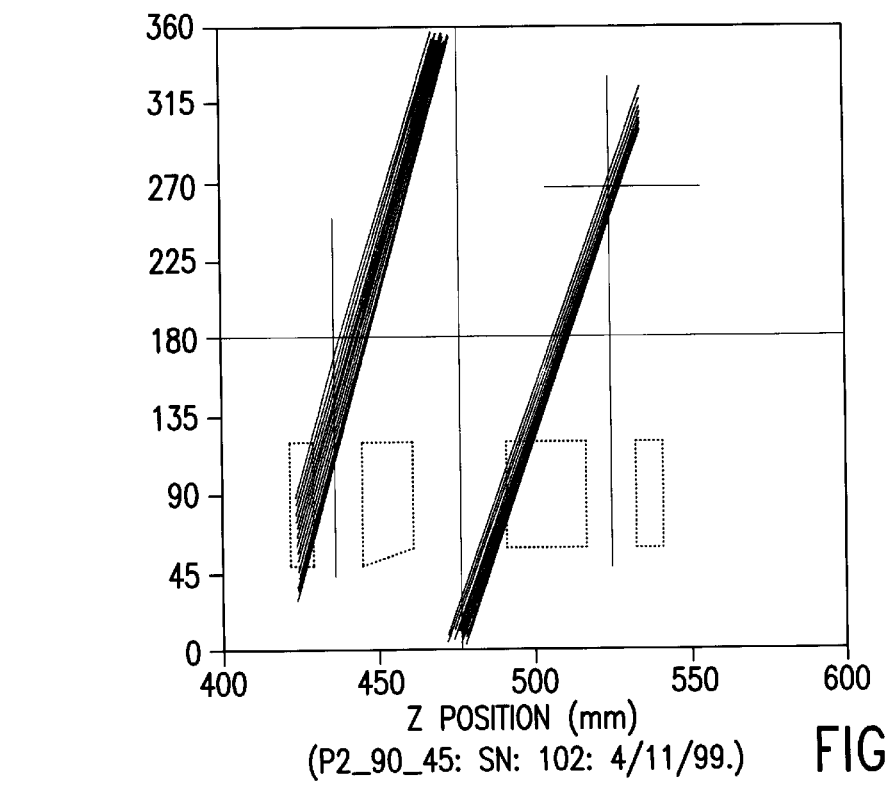
Figure 20A:
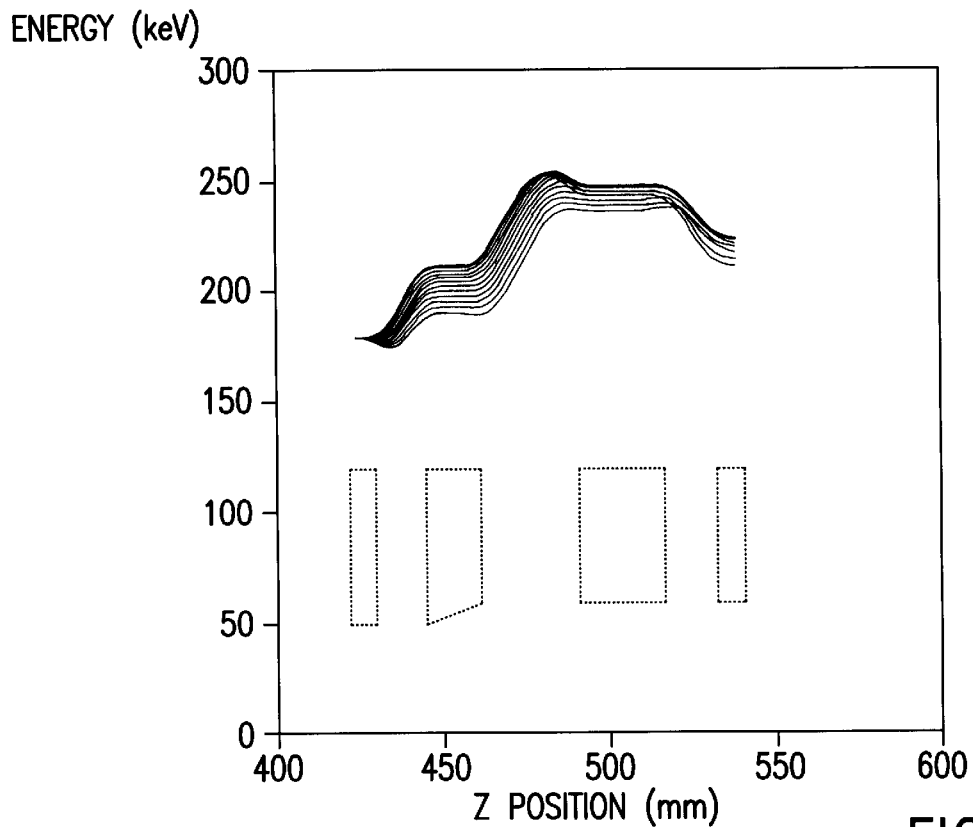
Figure 20B:
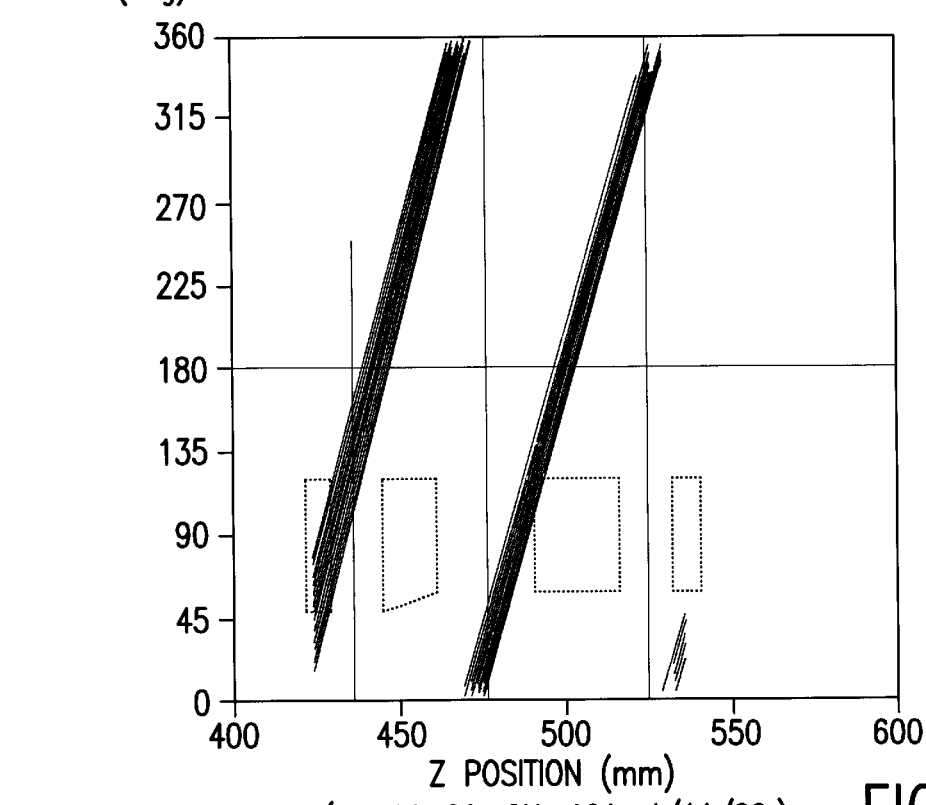

FIGS. 18A, 18B, 19A, 19B and 20A, 20B, show similar energy increment and phase representations for acceleration of $P^{++}$ ions with an injection energy of 180 keV (90 keV electrostatic acceleration voltage) and rf voltages of 70 kV, 45 kV and 20 kV respectively. A slightly higher electrostatic pre-acceleration voltage (90 keV) is used than for $B^+$ so that the injection speed of the $P^{++}$ ions is comparable to that for $B^+$ at 64 keV. The performance of the accelerator stage for $P^{++}$ions and an rf voltage of 70 kV is similar to that for $B^+$ ions illustrated in FIGS. 16A and 16B. For $P^{++}$ ions and an rf voltage of 45 kV, the ions cross the centre point of the third gap at phases slightly below 270°, so that the third gap does provide a small further energy increment as shown in FIG. 19A. For $P^{++}$ ions and an rf voltage of 20 kV, the ions cross the third gap at phases above 270°, so that the third gap produces a deceleration as illustrated in FIG. 20A. In each of FIGS. 18, 19 and 20, it can be seen that the energy spread for ions leaving the acceleration stage is less than ±5% even though the accepted ions have a phase range of 60°.

Figure 21A:
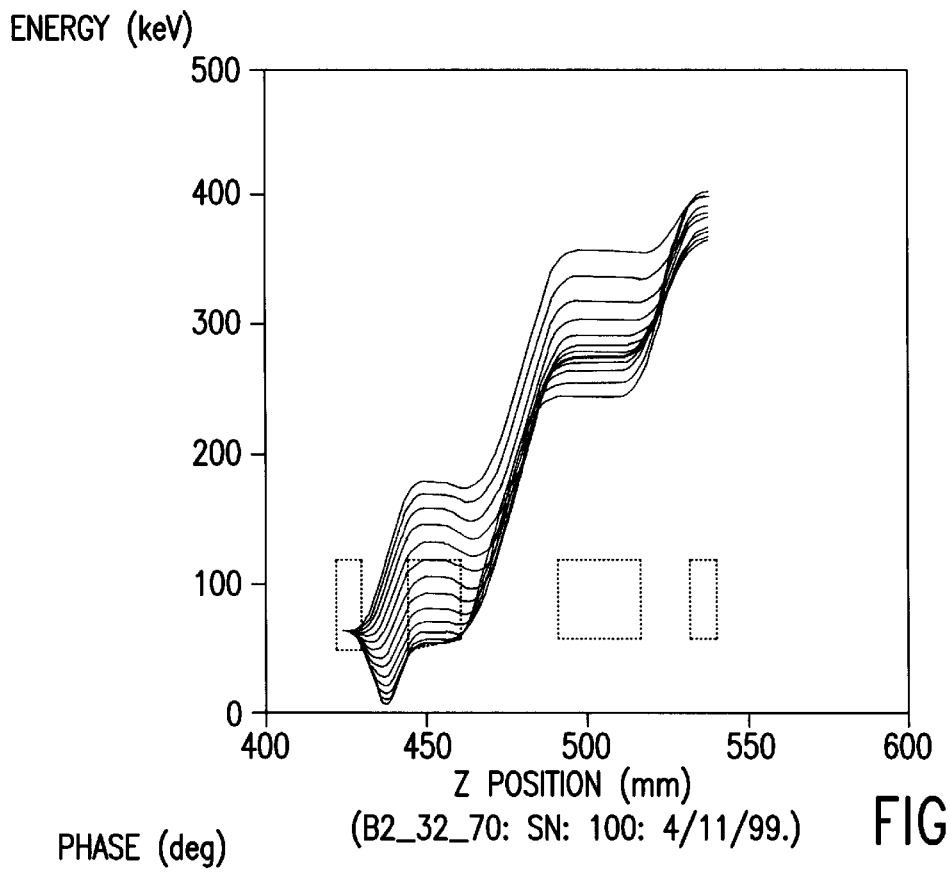
FIGS. 21A and 21B are graphical representations corresponding to FIGS. 15A and 15B, but for $B^{++}$ ions.
Figure 21B:
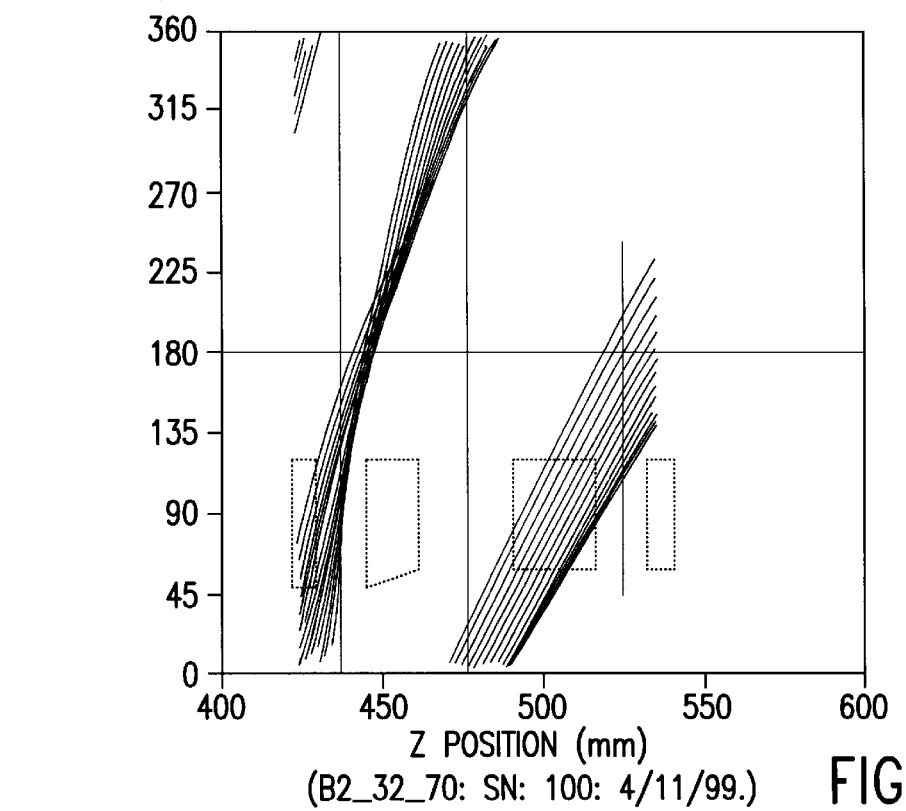

Turning now to FIGS. 21A and 21B, these illustrate the energy increments and phasing of $B^{++}$ ions through the accelerator stage having the same dimensions. In this case, the injection energy of the $B^{++}$ ions is 64 keV (an electrostatic pre-acceleration voltage of 32 kV), and the rf voltage is set at 70 kV. The Figures represent ions entering the first gap and crossing the centre of the first gap at phase angles below 180° so that later ions are accelerated more than the early ions. In fact, early ions cross the centre point of the gap at phase angles slightly below 90°, implying deceleration across the gap as is illustrated by the bottom lines in the energy increment diagram of FIG. 21A.

Because of the double charge on the boron ions, the acceleration provided by the rf voltage is double that of singly charged boron ions so that the energy dispersion produced by the first gap is substantially greater, as can also be seen in FIG. 21A. Given the low injection energy for the ions, the reduction in phase spread resulting from this energy dispersion is much greater and in fact the phase spread reverses so that ions crossing the first gap early, cross the centre of the second gap relatively late.

Nevertheless, the ions cross the centre of the middle gap around 360/0° to receive maximum energy boost from this gap and then cross the centre line of a third gap mostly at phase angles below 180°. Thus, the ions cross the third gap when the field is rising from maximum deceleration to maximum acceleration.

However, because of the reversal of phase spread produced by the first gap, ions crossing the first gap early now cross the third gap relatively late and receive additional energy. Thus, in the case of $B^{++}$ ions, crossing the third gap before 180° is effective to remove the energy dispersion introduced by the first gap.

As can be seen from FIG. 21A, the energy dispersion of ions from the accelerator stage is again about ±5%. It may be noted that the phase spread of ions injected into the accelerator stage is 110° or more. This implies remarkable efficiency in terms of the amount of an unbunched injected beam of $B^{++}$ ions which can be accelerated by the assembly to a target energy with only ±5% energy dispersion. This is achieved in the present invention because of the relatively low injection energy E compared to the maximum rf voltage amplitude V. In fact, the significant factor is the injection energy per charge state of injected ions (E/e). At such low relative injection energy, the applied rf voltage is effective to reverse the phase spread of the ions so that late ions at the first gap become early ions at the third gap. Then, by arranging for the ions to cross the third gap when the rf voltage at the third gap is rising towards maximum acceleration, the energy dispersion of the first gap can be nearly fully removed.

More generally, improvements are obtained if E is less than 2V.e. Then some reduction in phase spread of the ions occurs by the time the ions cross the central gap so that the amount of energy dispersion introduced by the central gap is reduced. In summary, the ion implanter may comprise an ion beam generator for generating a beam of ions to be implanted, in which said ions are at an injection energy E, a three gap linear accelerator stage into which said beam of ions is directed at said injection energy, said stage being arranged when energised for accelerating ions of said beam to a second energy, said stage comprising an entrance electrode held at a fixed potential, an exit electrode held at a fixed potential, first and second radio frequency electrodes located in series between said entrance and exit electrodes, and a radio frequency generator to apply, respectively to said first and second radio frequency electrodes, radio frequency voltages of opposite polarity and having a maximum amplitude V relative to ground, said ion beam generator being arranged to control said injection energy E so that E<2V.e, where e is the charge state of said ions. E may be less than V.e, or even less than ½V.e.

Figure 22A:
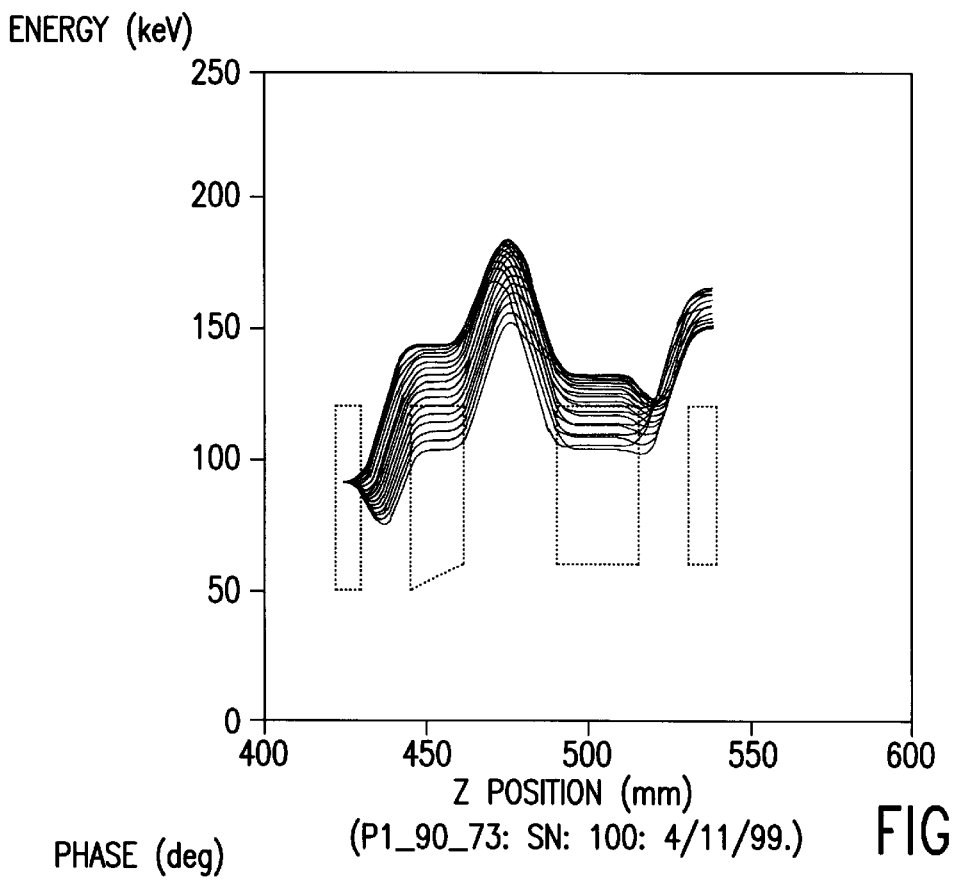
FIGS. 22A and 22B are graphical representations corresponding to FIGS. 15A and 15B, but for $P^+$ ions.
Figure 22B:
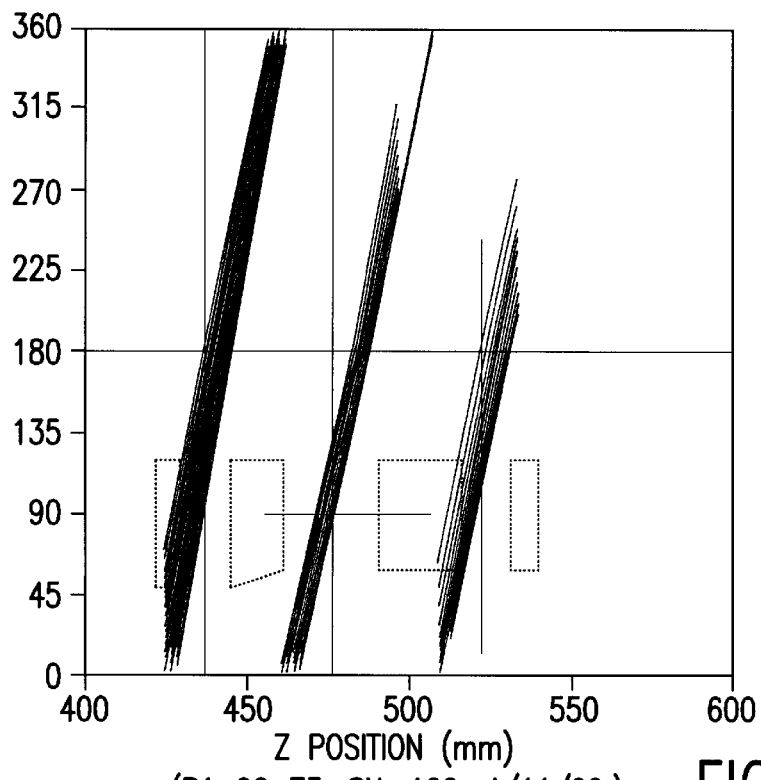

The structure of the rf accelerator stage as described above may also be used for providing some acceleration to $P^+$ ions. The energy increment and phasing of $P^+$ ions passing through the accelerator stage are illustrated in FIGS. 22A and 22B. The ions should be injected into the accelerator at the highest available energy, here 90 keV. Even then, because of the higher mass/charge ratio of $P^+$ ions (m/e=31), the speed of the ions entering the accelerator is half that of $P^{++}$ from the same electrostatic pre-acceleration voltage. As a result, the ions cross the centre of the second gap at about 90° phase, at which they receive minimal overall acceleration from the central gap but a maximum amount of energy dispersion counteracting the energy dispersion introduced by the first gap. The resulting energy dispersion has both ions which were early and late at the first gap having a relatively lower energy leaving the second gap, and ions entering the first gap in the middle of the range, having a higher energy leaving the second gap. The third gap is then effective to reduce the energy of the earlier ions relative to the ions arriving later at the third gap, with an overall effect of further reducing the energy spread of the ions leaving the third gap. As can be seen from FIG. 22A, the resultant energy spread is about ±5% from a phase spread of injected ions of again about 110°. The energy increment achieved in the accelerator for $P^+$ ions is about 60 keV.

It can be seen, therefore, that although the rf accelerator stage could be said to be operating relatively inefficiently, in that the energy increment provided is much less than the theoretical maximum (4 V.e), useful energy increments can nevertheless be obtained even though the three gap accelerator stage is by no means optimised for $P^+$ ions.

Summarising, by carefully designing the three gap accelerator stage to be optimised for $B^+$ ions (and nearly optimised for P++ ions), an arrangement is provided in which a relatively high proportion of injected ions can be accelerated to within a small percentage of the target energy. Importantly also, the output energy of the accelerator stage can easily be varied by adjusting the applied rf amplitude, while maintaining efficiency in terms of the proportion of injected ions delivered at or close to the desired output energy. This level of flexibility is highly desirable in an ion implanter and results from the particular features detailed above.

Figure 23:
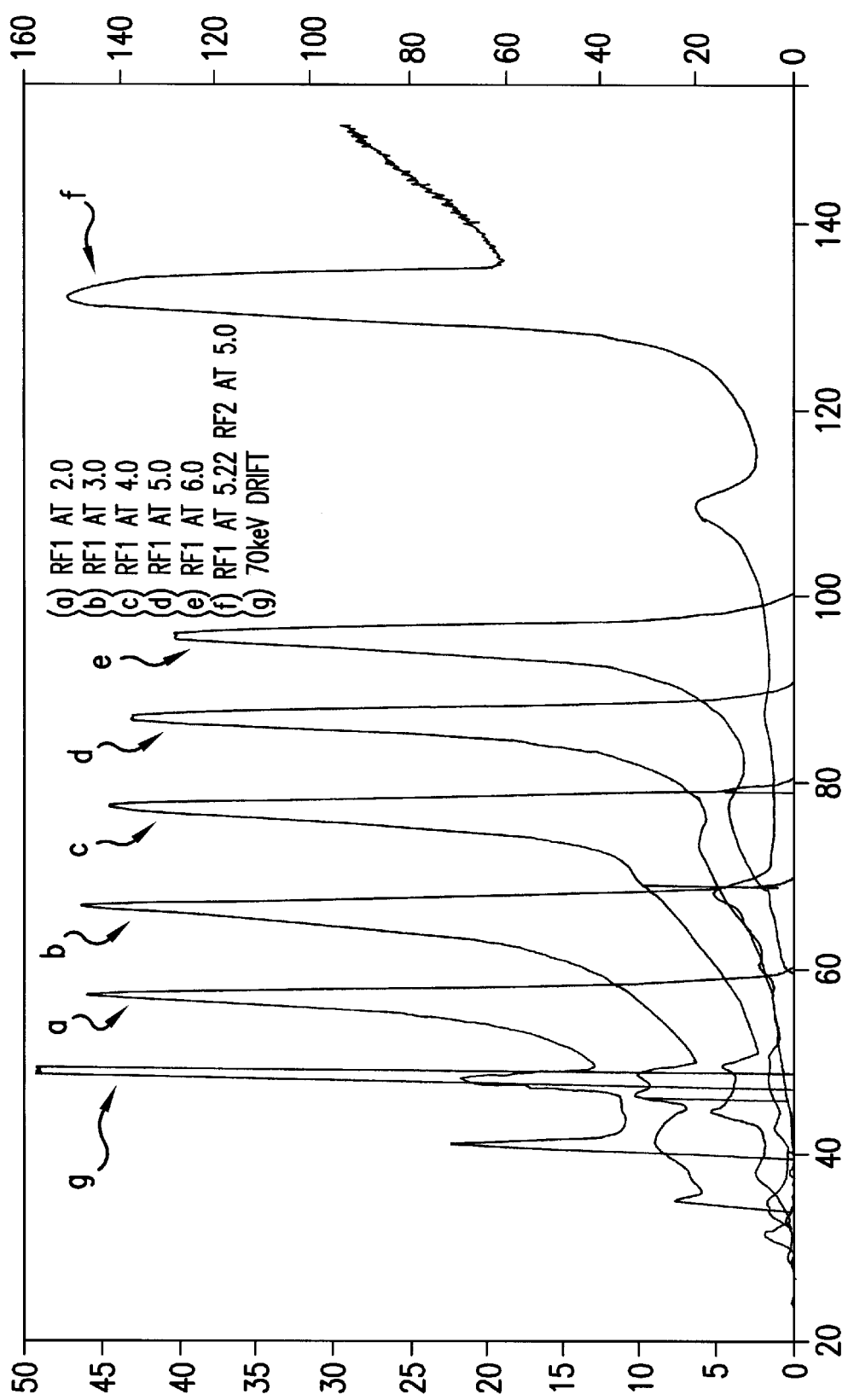
FIG. 23 is a graphical representation of beam current against output energy for a two stage three gap booster as represented in FIG. 13 for different rf amplitudes.

The flexibility of the arrangement is illustrated in FIG. 23. This is a plot, in arbitrary units, of energy along the x-axis against beam current along the y-axis, of the beam ions delivered by the rf accelerator assembly described above, with two three gap accelerating cavities. Plot g represents the delivered beam at the injection energy of 70 keV with the rf accelerator in drift mode. Plots a to e represent the delivered beam with the second booster stage inactive and at five incremental settings of the amplitude of the rf voltage applied to the first booster stage. As can be seen, both the beam current and the beam energy spread is remarkably constant for increasing output energies. These are highly desirable characteristics which ensure the first booster stage can deliver well controlled bunches of ions at good beam currents to the second booster stage over a range of intermediate energies. Plot f represents the delivered beam at a higher energy with both the first and second booster stages energised with respective rf amplitudes.

As described above in relation to FIG. 13, an accelerator assembly comprising two three gap accelerator stages can be set up for operation with ions of different mass/charge ratio by employing a fixed drift length between the two stages, and by adjusting the amplitude of the rf voltage applied to the first accelerator stage, while the phases of the two stages are locked to respective fixed values. For B+ ions travelling along the drift distance 300 (FIG. 13) between the two accelerator stages at an energy of 300 keV, the flight time from the exit electrode of the first stage to the entrance electrode of the second stage is about 212 nsec. On the other hand the period of the applied rf voltage (approximately 20 MHz) is about 50 nsec. This means that ions arriving at the first gap of the second accelerator cavity can never be more than 25 nsec from the correct arrival time. This implies that, depending upon the final design, for B+ ions, the flight time of the ions through the drift length 300 might have to be increased by a maximum of 25 nsec, which for a drift length of 478 mm would imply a reduction in output energy from the first accelerator stage from 300 keV to about 241 keV (30%).

More significant, with the phase of the rf voltage in the second accelerator cavity locked to exactly the same fixed phase value as the voltage in the first cavity, then the flight time of B+ ions should be reduced by only 12 nsec to arrive correctly at the second cavity, implying an increment to the energy of the B+ ions leaving the first accelerator stage of about 12%. For B++ ions at 400 keV, the flight time along the drift length 300 would be 184 nsec, implying a required reduction in the energy of the B++ ions of about 16% to arrive correctly. The flight time for P++ leaving the first accelerator stage of 600 keV would be 252 nsec, implying an energy increase in order for these ions to arrive correctly (after five cycles of the rf voltage instead of the four cycles as for B+ and B++) would be just 2%. For P+ leaving the first accelerator stage at 200 keV, the flight time over the drift length 300 would be 436 nsec, implying a required reduction in energy in order to arrive correctly (after nine cycles of the rf voltage) of just 14%.

In practice, in design of an ion implanter the various parameters of the accelerator assembly, such as the drift length 300, the frequency f of the rf voltage, may be selected to provide optimum performance for a selected ion species and to minimize the speed adjustment required for processing different ionic species.

As mentioned previously the rf accelerator assembly described above would normally incorporate a buncher structure located upstream of the first three gap accelerating stage or cavity. The buncher would be designed to capture up to 30% (or more) of the unbunched beam ions and produce a controlled energy spread in the captured ions so that they become physically bunched on entry into the first accelerating stage. In order to maximize the proportion of beam ions captured, a buncher does not give any overall energy increment to the bunched ions. A suitable buncher is a two gap structure energised at with a phase locked to a fixed reference phase. Arrival of bunches of different m/e at the first accelerator stage correctly is ensured by a small adjustment in the injection energy of beam ions from the mass selection magnet, thereby controlling the speed and flight time of the ions arriving in bunches at the first acceleration stage from the buncher. The rf amplitude is set to provide the required energy spread so that ions become bunched on reaching the first accelerator stage at the controlled injection energy.

What is claimed is:

1. An ion implanter comprising an ion beam generator for generating a beam of ions to be implanted in which said ions are at a first energy, and a radio frequency linear accelerator assembly arranged when energised for accelerating ions of said beam to a second energy, said assembly comprising electrodes defining a series of gaps for changing the energy of ions of said beam, said electrodes having apertures through which the ions pass, wherein the apertures of the electrodes defining the gaps of the accelerator assembly have respective first dimensions in a first orthogonal direction transverse to the beam direction and respective second dimensions in a second orthogonal direction transverse to the beam direction, said first dimension of the aperture of at least the first electrode defining the first gap being smaller than said second dimension of said first electrode aperture.

2. An ion implanter as claimed in claim 1, wherein said first dimension of the aperture of the second electrode defining a first gap of the accelerator assembly is smaller than said second dimension of said second electrode aperture.

3. An ion implanter as claimed in claim 1, wherein said first dimension of the apertures of each of the electrodes defining at least first and second gaps of the accelerator assembly is smaller than said second dimension of the aperture of the respective electrode.

4. An ion implanter as claimed in claim 1, wherein at least a sequential set of said electrodes each have said first aperture dimension smaller than said second aperture dimension, and there is at least one increment in the respective first dimensions along said sequential set of electrodes in the beam direction.

5. An ion implanter as claimed in claim 1, wherein said ion beam generator includes a mass analyser magnet having a dispersion plane aligned with said first orthogonal direction.

6. An ion implanter as claimed in claim 5, wherein said mass analyser magnet is arranged to bring the desired ions to be implanted in said beam to a substantial focus in said first orthogonal direction at a location along the beam which is not upstream relative to the first electrode.

7. An ion implanter as claimed in claim 6, wherein said accelerator assembly comprises at least first and second rf booster stages in tandem along the beam direction, each booster stage comprising entrance and exit electrodes and at least one intermediate rf electrode together constituting said electrodes defining said gaps, the entrance electrode of the first booster stage being said first electrode, and the implanter further comprises a first magnetic quadrupole upstream of said first booster stage, a first power supply connected to energise said first quadrupole for focusing beam ions in said first orthogonal direction and defocusing said ions in said second orthogonal direction, a second magnetic quadrupole downstream of said first booster stage, and a second power supply connected to energise said second quadrupole for focusing beam ions in said first orthogonal direction and defocusing said ions in said second orthogonal direction.

8. An ion implanter as claimed in claim 7 and including a third magnetic quadrupole between said second quadrupole and said second booster stage and a third power supply connected to energise said third quadrupole for focusing beam ions in said second orthogonal direction and defocusing said ions in said first orthogonal direction.

9. An ion implanter comprising:
an ion beam generator for generating a beam of ions to be implanted, in which said ions have a predetermined mass/charge ratio and are at an injection energy E, and
a three gap linear accelerator stage into which said beam of ions is directed at said injection energy, said stage being arranged when energized for accelerating ions of said beam to a second energy, said stage comprising
an entrance electrode held at a fixed potential and an exit electrode held at a fixed potential,
first and second ratio frequency electrodes located in series between said entrance and exit electrodes, and
a radio frequency generator to apply radio frequency voltages of opposite polarity and a predetermined frequency f respectively to said first and second electrodes,
said entrance electrode and said first radio frequency electrode defining a first accelerating gap having a first center point, said first and second radio frequency electrodes defining a second accelerating gap having a second center point at a first predetermined spacing $d_1$ from said first center point, and said second radio frequency electrode and said exit electrode defining a third accelerating gap having a third center point at a second predetermined spacing $d_2$ from said second center point,
wherein the injection energy E, the frequency f, and the gap spacings $d_1$ and $d_2$ are selected such that at amplitudes of the radio frequency energy below the maximum amplitude at which breakdown occurs across any of said gaps, injected ions of said beam cross the first gap when the radio frequency field across the first gap is rising from a maximum deceleration field to a maximum acceleration field, then cross the second gap during the maximum acceleration field across the second gap and cross the third gap when the field across the third gap is falling from a maximum acceleration field to a maximum deceleration field.

10. An ion implanter comprising an ion beam generator for generating a beam of ions to be implanted in which said ions are at a first energy, and a radio frequency linear accelerator assembly arranged when energized for accelerating ions of said beam to a second energy, said assembly comprising,
a housing,
electrodes mounted in the housing, said electrodes defining a series of gaps for changing the energy of ions of said beam, said electrodes having apertures through which the ions pass,
at least one inductive coil electrically connected to at least one of said electrodes for energizing said at least one electrode at a radio frequency potential, and
an electrically conductive enclosure around said coil,
said coil, said at least one electrode, said housing and said conductive enclosure together constituting a radio frequency tank circuit having a predetermined resonant frequency,
said coil comprising a self supporting rigid electrical conductor having at least first and second connecting arms, said linear accelerator assembly further including,
a coil mounting fixture on said electrically conductive enclosure arranged to receive said first connecting arm for electrical connection to said enclosure and for supporting said coil at a desired location within said enclosure, and
an electrically insulating mount locating said at least one electrode within said housing, said second connection arm extending from said enclosure into said housing to make radio frequency connection to said at least one electrode,
said at least one electrode having a connection fitting providing a sliding fit connection with said second connecting arm, whereby thermal expansion and contraction of said coil is accommodated by sliding movement of said second arm in said fitting.

11. An ion implanter as claimed in claim 10, wherein said electrically insulating mount and said connection fitting being on opposite sides of said at least one electrode, in a direction transverse to the beam direction.

12. An ion implanter as claimed in claim 11, wherein said electrically insulating mount comprises a mounting rod extending from said housing and said mounting rod and said second connection arm of said coil are substantially co-axial on opposite sides of said at least one electrode.

13. An ion implanter comprising an ion beam generator for generating a beam of ions to be implanted in which said ions are at a first energy, and a radio frequency linear accelerator assembly arranged when energised for accelerating ions of said beam to a second energy, said assembly comprising a housing, electrodes mounted in the housing, said electrodes defining a series of gaps for changing the energy of ions of said beam, said electrodes having apertures through which the ions pass, at least one inductive coil electrically connected to at least one of said electrodes for energising said at least one electrode at a radio frequency potential, and an electrically conductive enclosure around said coil, said coil, said at least one electrode, said housing and said conductive enclosure together constituting a radio frequency tank circuit having a predetermined resonant frequency, said coil comprising a tubular electrical conductor having an open end and a closed end, said linear accelerator assembly including a connecting fixture on said electrically conductive enclosure to receive said open end to enable access to said open end from outside said enclosure, and a double walled cooling tube extending in said tubular conductor from said open end to a position proximate said closed end, said cooling tube comprising an inner pipe which is open at said proximate position to the interior of said tubular conductor and an outer pipe which is closed at said proximate position, said inner and outer pipes providing a space between them along the length of said cooling tube, a source of vacuum connected to said outer pipe to evacuate said space between said inner and outer pipes, and a source of cooling fluid connected to one of said inner pipe and said open end of said tubular conductor to provide a flow of said cooling fluid along said tubular conductor.

14. An ion implanter comprising:
an ion beam generator for generating a beam of ions to be implanted in which said ions are at a first energy, and
a radio frequency linear accelerator assembly arranged when energized for accelerating ions of said beam to a second energy, said assembly comprising,
electrodes defining a series of gaps for changing the energy of ions of said beam, said electrodes having apertures through which the ions pass,
at least one magnetic quadrupole located along the beam adjacent at least one of said electrodes for controlling beam divergence,
a unitary block providing a vacuum housing for the assembly, said unitary block having a through channel for said beam to pass through,
at least first and second electrode mounting points at spaced locations along said through channel for mounting said electrodes to define a plurality of said gaps along the length of said through channel, and
at least one magnetic quadrupole mounting point located between said first and second electrode mounting points for mounting said magnetic quadrupole.

15. An ion implanter as claimed in claim 14, wherein said magnetic quadruple mounting point of said block comprises a generally tubular portion of said block co-axial with said through channel, four apertures spaced uniformly about the circumference of said tubular portion, and a respective sealing flange provided around each of said apertures, and wherein said magnetic quadrupole has a respective pole piece mounted at each of said sealing flanges so as to extend through the respective aperture into said tubular portion, said sealing flanges providing vacuum seals between the pole pieces and said block.

16. An ion implanter as claimed in claim 15, wherein the magnetic quadrupole has a respective pole winding for each pole piece, said pole winding being located outside said sealing flanges so as to be in atmosphere when the vacuum housing is evacuated.

17. A method of implanting ions into a target substrate comprising the steps of:
generating a beam of the ions at a first energy, and
changing the energy of ions in the beam to a second energy using a radio frequency (rf) linear accelerator assembly having at least first and second booster stages in tandem along the beam direction, each of the booster stages comprising entrance and exit electrodes and at least one intermediate rf electrode defining a series of gaps for changing the energy of ions of said beam, the exit electrode of the first booster stage and the entrance electrode of the second booster stage defining between them a drift distance between the stages over which beam ions are not subject to rf fields, said drift distance being greater than the length of the first booster stage between the entrance and exit electrodes thereof, wherein the arrival time at the second booster stage of bunches of ions from the first booster stage, relative to the rf field waveform in the gaps of the second booster stage, is controlled by
maintaining the phases of the rf fields in said first and second booster stages locked to fixed phase values, and adjusting the speed of said bunches over said drift distance so that said bunches arrive at the second booster stage at a desired region of said field waveform.

18. A method of implanting ions as claimed in claim 17, wherein said speed is adjusted by adjusting the amplitude of the rf fields in the first booster stage.

19. A method of implanting ions as claimed in claim 17, wherein the linear accelerator assembly is changed from being set up for accelerating beam ions of a first mass/charge ratio to a set up for accelerating beam ions of a second mass/charge ratio by adjusting the speed over said drift distance of said ions of second mass/charge ratio while maintaining the phases of rf fields in said first and second booster stages locked to fixed phase values.

20. An ion implanter comprising:
an ion beam generator for generating a beam of ions to be implanted, in which said ions are at a first energy, and
a radio frequency (rf) linear accelerator assembly arranged, when energized, for accelerating ions of said beam to a second energy, said assembly comprising at least first and second rf booster stages in tandem along the beam direction, each of said booster stages comprising,
entrance and exit electrodes,
at least one intermediate rf electrode defining a series of gaps for changing the energy of ions of said beam,
the exit electrode of the first booster stage and the entrance electrode of the second booster stage defining between them a drift distance between the stages over which beam ions are not subject to rf fields, said drift distance being greater than the length of the first booster stage between the entrance and exit electrodes thereof, and
a controller arranged to control the arrival time at the second booster stage of bunches of ions from the first booster stage, relative to the rf field waveform in the gaps of the second booster stage, by maintaining the phases of the rf fields in said first and second booster stages locked to fixed phase values and adjusting the speed of said bunches over said drift distance so that said bunches arrive at the second booster stage at a desired region of said field waveform.

21. An ion implanter as claimed in claim 20, wherein said drift distance is about twice said length.

22. An ion implanter as claimed in claim 20, wherein said controller is arranged to adjust said speed of said ion bunches by adjusting the amplitude of the rf fields in the first booster stage.

23. An ion implanter comprising:
an ion beam generator for generating a beam of ions to be implanted in which said ions are at a first energy, and
a radio frequency linear accelerator assembly arranged when energized for accelerating ions of said beam to a second energy, said assembly comprising at least first and second rf booster stages in tandem along the beam direction, each of said booster stages comprising,
entrance and exit electrodes,
at least one intermediate rf electrode defining a series of gaps for changing the energy of the ions of said beam, and
an adjacent pair of magnetic quadrupoles located between said first and second booster stages,
said electrodes having apertures through which the ions pass, all the electrodes of all said booster stages being contained in a length L and the apertures of the electrodes having respective largest dimensions transverse to the beam which are not less than D, where L/D is less than 25.

24. A method of operating a three gap radio frequency (rf) accelerator stage for accelerating ions of a selected mass/charge ratio from an injection energy E to a second energy, comprising;

providing the accelerator stage energizable with a maximum rf voltage having a maximum amplitude A without breakdown occurring, applying an rf voltage of frequency f to generate corresponding rf accelerating fields in the accelerator stage, and selecting the injection energy E, the frequency f and the spacings $d_1$ and $d_2$ between the centers of the first and second gaps and between the second and third gaps respectively of the accelerator stage, such that, with the rf voltage amplitude not greater than amplitude A, said ions cross the first gap when the radio frequency field across the first gap is rising from a maximum deceleration field to a maximum acceleration field, then cross the second gap during the maximum acceleration field across the second gap and cross the third gap when the field across the third gap is falling from the maximum acceleration field to the maximum deceleration field.

25. A method as claimed in claim 24, wherein the amplitude of the rf voltage is adjusted to values less than A to reduce the second energy.

26. An ion implanter comprising an ion beam generator for generating a beam of ions to be implanted in which said ions are at a first energy, and a radio frequency linear accelerator assembly arranged when energised for accelerating ions of said beam to a second energy, said assembly comprising a housing, electrodes mounted in the housing, said electrodes defining a series of gaps for changing the energy of ions of said beam, said electrodes having apertures through which the ions pass, at least one inductive coil electrically connected to at least one of said electrodes for energising said at least one electrode at a radio frequency potential, an electrically conductive enclosure around said coil, said coil, said at least one electrode, said housing and said conductive enclosure together constituting a radio frequency tank circuit having a predetermined resonant frequency, a coupling loop mounted in said enclosure, and a feed through permitting supply of rf power to said coupling loop for coupling said power to said resonant tank circuit, said coupling loop being mounted for rotary adjustment in said enclosure for changing the coupling efficiency of rf power to the tank circuit.

27. An ion implanter as claimed in claim 26, wherein said enclosure has a wall, a circular mounting plate having an axis and located in the wall for rotary adjustment about said axis, said coupling loop being mounted on said plate for rotary adjustment therewith, said feed through extending from said loop through said mounting plate.

28. An ion implanter as claimed in claim 27, wherein said wall has a circular sealing surface extending outwardly relative to the enclosure, and said circular mounting plate seals against said sealing surface.

29. An ion implanter as claimed in claim 27, including an adjustment scale on one of said circular mounting plate and adjacent surfaces of said enclosure wall, and a marker on the other thereof, said scale and said marker being visible from outside said enclosure for indicating a desired angular position of said coupling loop.

* * * * *